US012376430B2

(12) United States Patent
David

(10) Patent No.: US 12,376,430 B2
(45) Date of Patent: Jul. 29, 2025

(54) LIGHT EMITTING DIODES WITH DIRECTIONAL EMISSION AND DISPLAYS INCLUDING THE SAME

(71) Applicant: Google LLC, Mountain View, CA (US)

(72) Inventor: Aurelien Jean Francois David, San Francisco, CA (US)

(73) Assignee: Google LLC, Mountain View, CA (US)

( * ) Notice: Subject to any disclaimer, the term of this patent is extended or adjusted under 35 U.S.C. 154(b) by 412 days.

(21) Appl. No.: 17/909,115

(22) PCT Filed: Apr. 20, 2020

(86) PCT No.: PCT/US2020/029016
§ 371 (c)(1),
(2) Date: Sep. 2, 2022

(87) PCT Pub. No.: WO2021/216039
PCT Pub. Date: Oct. 28, 2021

(65) Prior Publication Data
US 2023/0101054 A1    Mar. 30, 2023

(51) Int. Cl.
*H10H 20/821* (2025.01)
*H01L 25/075* (2006.01)
*H10H 20/814* (2025.01)

(52) U.S. Cl.
CPC ....... *H10H 20/821* (2025.01); *H01L 25/0753* (2013.01); *H10H 20/814* (2025.01)

(58) Field of Classification Search
CPC . H10H 20/821; H10H 20/814; H01L 25/0753
See application file for complete search history.

(56) References Cited

U.S. PATENT DOCUMENTS 7,876,350 B2 *  1/2011  Shin ............... G09G 3/003
                                              348/42
2018/0277523 A1 *  9/2018  Ahmed ............ H10H 20/856
(Continued)

FOREIGN PATENT DOCUMENTS

WO    2018222332 A1    12/2018

OTHER PUBLICATIONS

Deller, et al., "Uniform white light distribution with low loss from coloured LEDs using polymer doped polymer mixing rods", Proceedings of SPIE—The International Society for Optical Engineering, v 5530, Fourth International Conference on Solid State Lighting, Aug. 2-6, 2004, pp. 231-239.

(Continued)

*Primary Examiner* — Mark W Tornow
(74) *Attorney, Agent, or Firm* — Brake Hughes Bellermann LLP

(57) ABSTRACT

A full color display includes multiple pixels and has a white point, a direction of emission and a solid angle of emission around the direction of emission characterized by a half-cone angle $\theta$. Each pixel includes: a sub-pixel including a red LED having a first geometry emitting red light into a range of emission angles, such that a fraction of the power emitted within the solid angle of emission is at least $1.2*(1-\cos(\theta)^2)$; a sub-pixel including a green LED having a second geometry emitting green light into a range of emission angles, such that a fraction of the power emitted within the solid angle of emission is at least $1.2*(1-\cos(\theta)^2)$; and a sub-pixel including a blue LED emitting blue light into a range of emission angles, such that a fraction of the power emitted within the solid angle of emission is at least $1.2*(1-\cos(\theta)^2)$. The LEDs are configured such that, in any direction within the solid angle of emission, white light (Continued)

emitted by the display has a chromaticity difference Du'v' from the white point of the display which is less than 0.01.

20 Claims, 16 Drawing Sheets

(56) References Cited

U.S. PATENT DOCUMENTS

2019/0199982 A1* 6/2019 Schubert .............. H04N 13/324
2024/0310009 A1* 9/2024 Matsumoto .............. F21K 9/64

OTHER PUBLICATIONS

Wang, et al., "The contribution of sidewall light extraction to efficiencies of polygonal light-emitting diodes shaped with laser micromachining", Journal of Applied Physics, 2010, v. 108 n. 2, Jul. 2010, pp. 023110-1-023110-5.
International Preliminary Report on Patentability for PCT Application No. PCT/SU2020/029016, mailed on Nov. 3, 2022, 13 pages.
Kölper, et al., "Optical Properties of Individual Gan Nanorods for Light Emitting Diodes: Influence of Geometry, Materials, and Facets", Physics and Simulation of Optoelectronic Devices XIX, SPIE, vol. 7933, No. 1, Feb. 10, 2011, 9 pages.

* cited by examiner

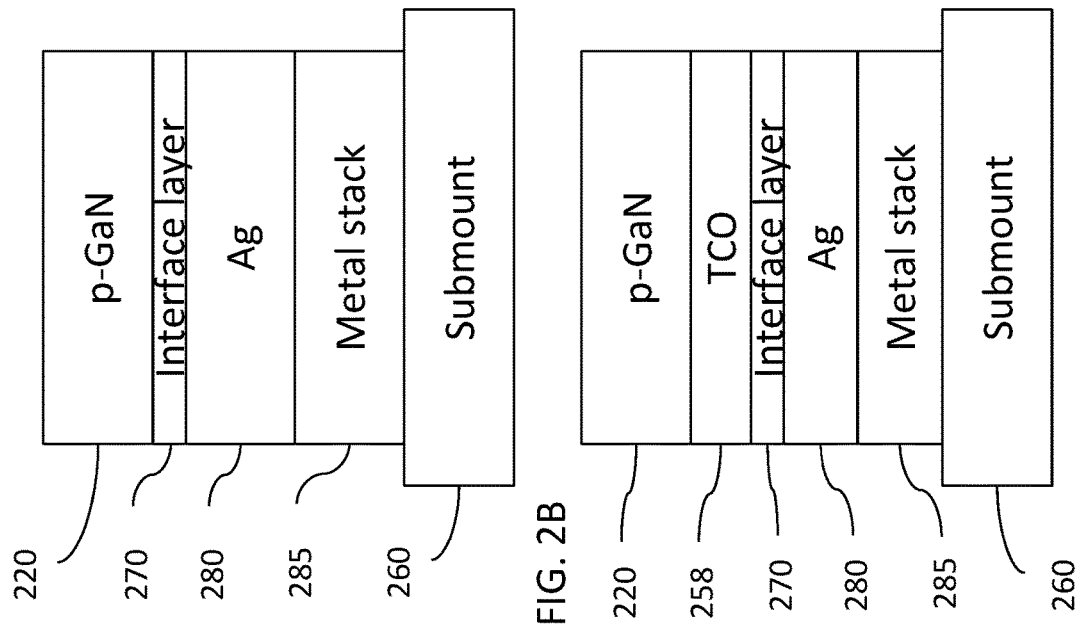
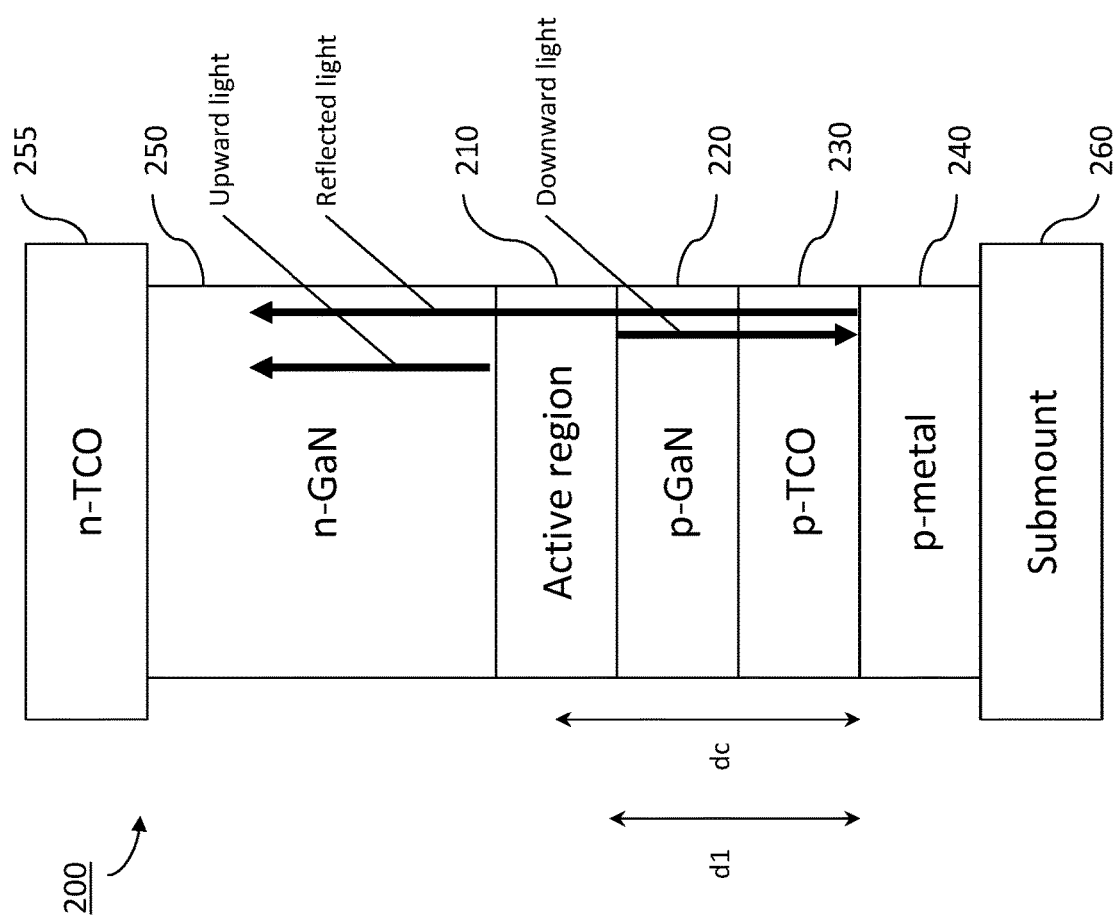
FIG. 2A
FIG. 2B
FIG. 2C

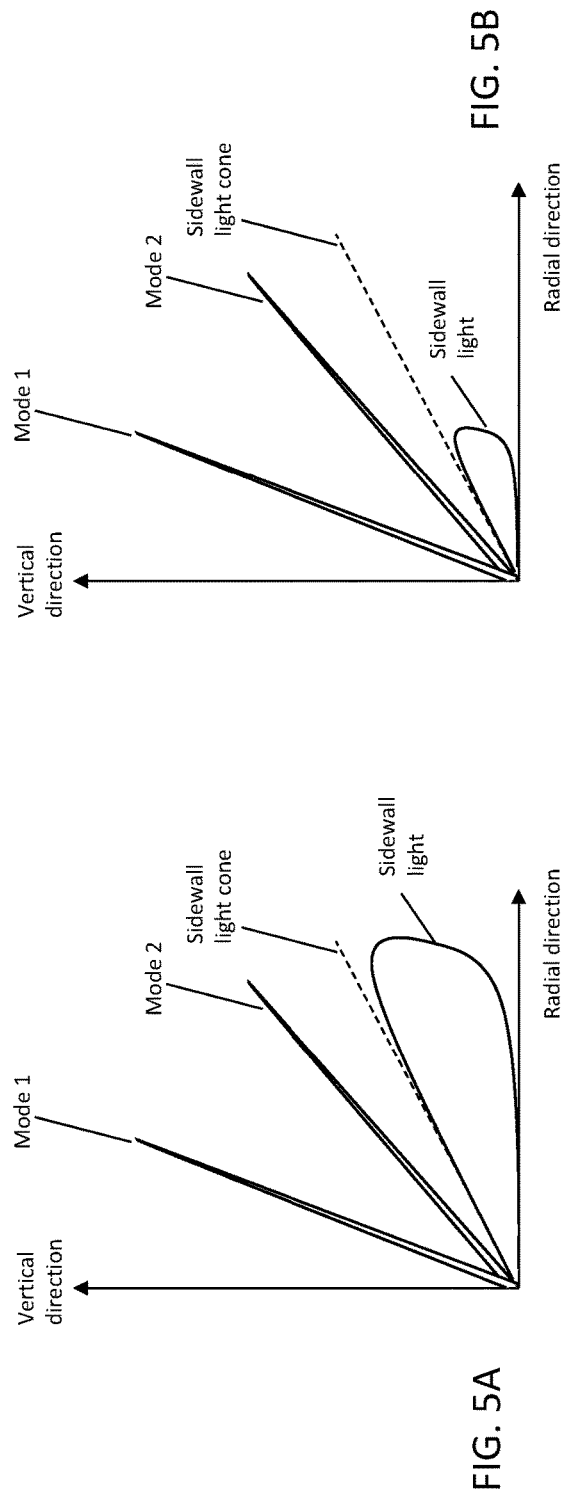
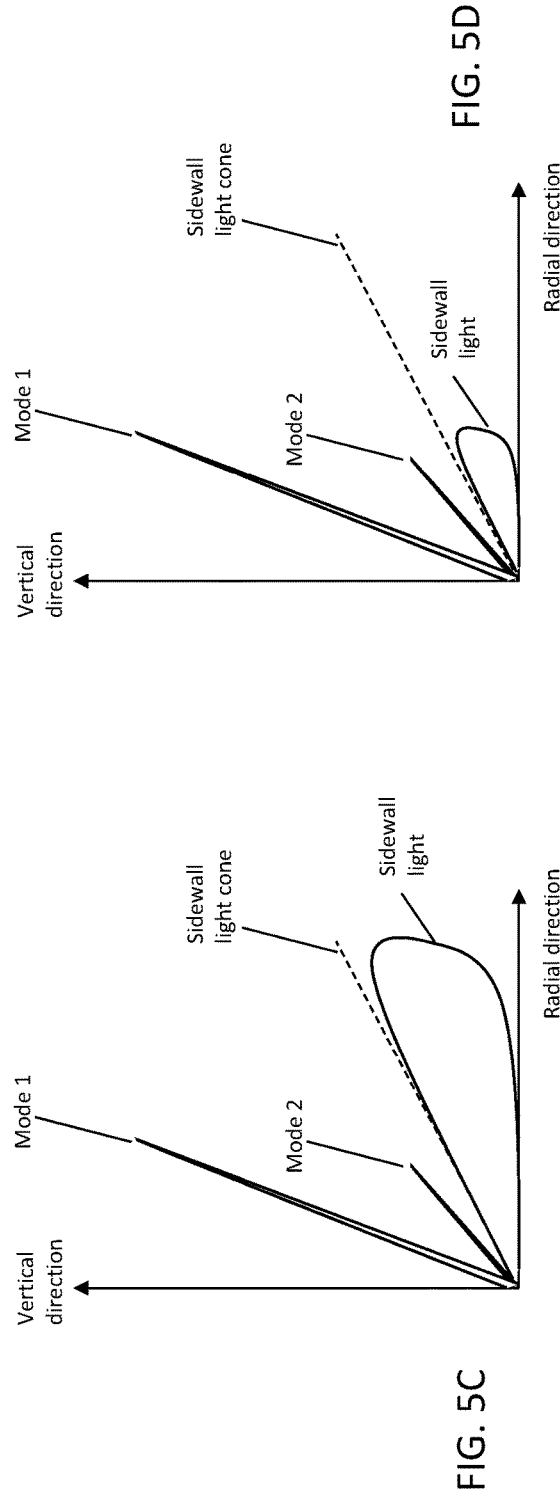
FIG. 5A
FIG. 5B
FIG. 5C
FIG. 5D

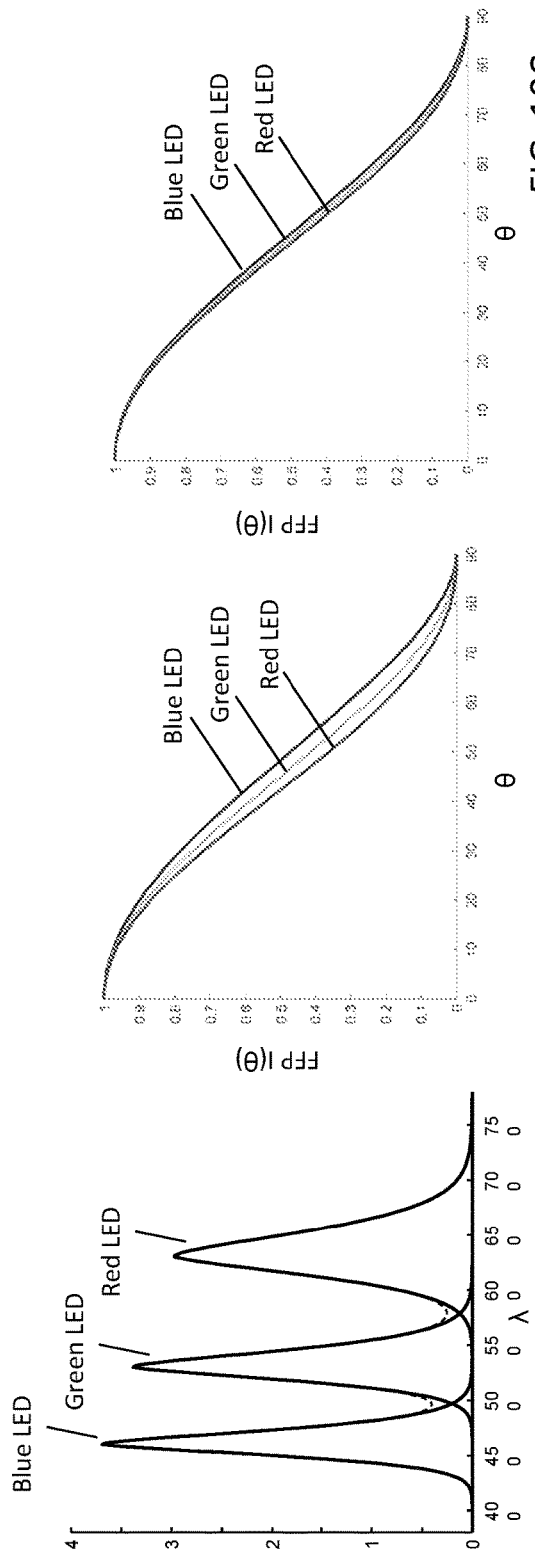
FIG. 10C
FIG. 10B
FIG. 10A
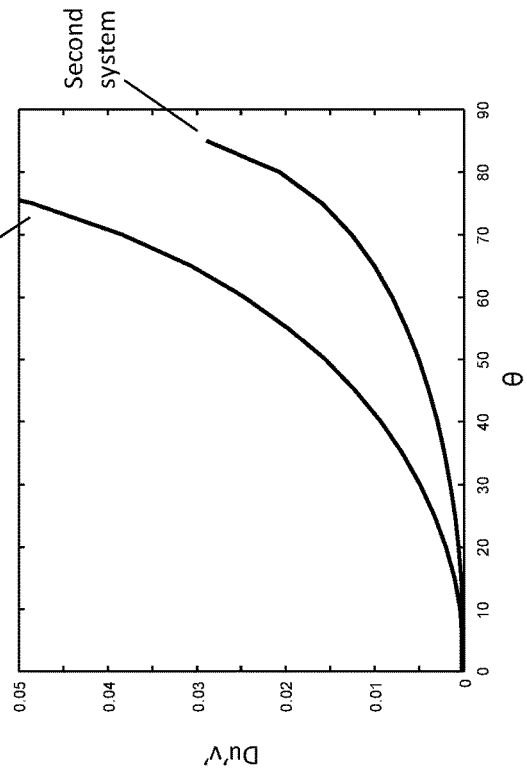
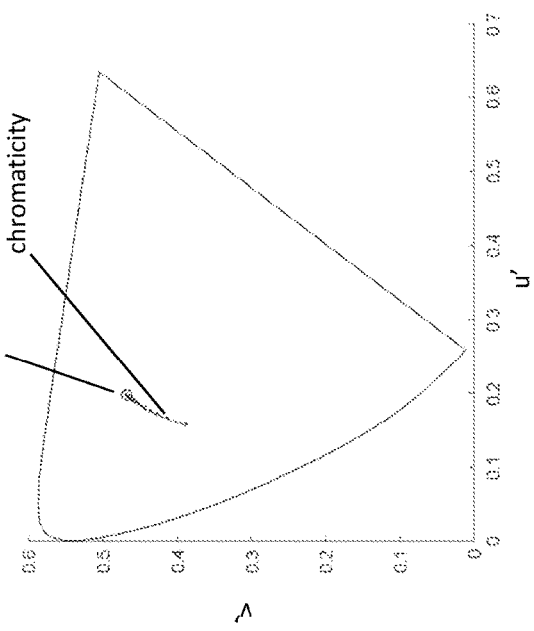
FIG. 10E
FIG. 10D

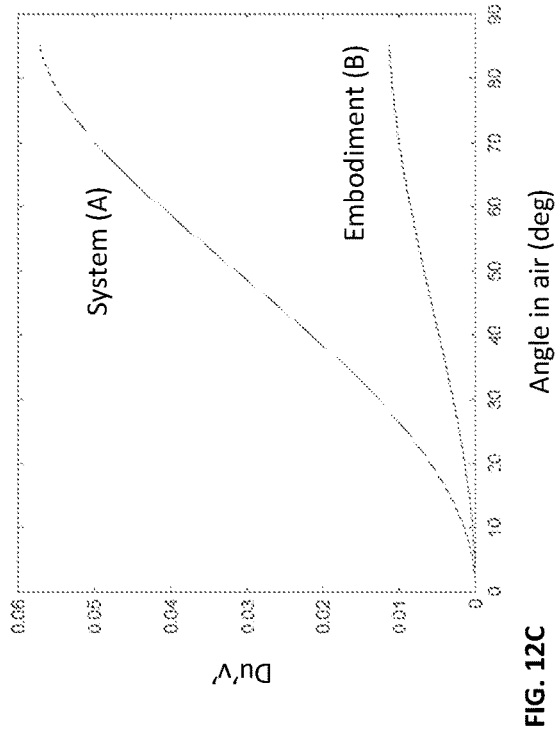
FIG. 12A
FIG. 12B
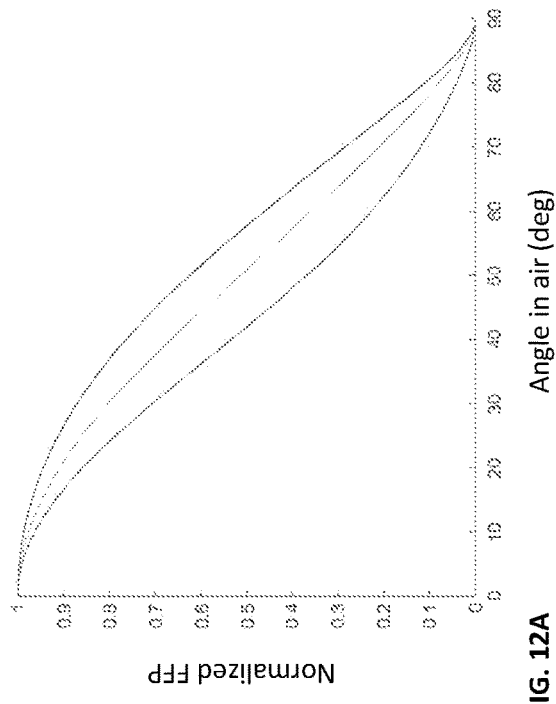
FIG. 12C
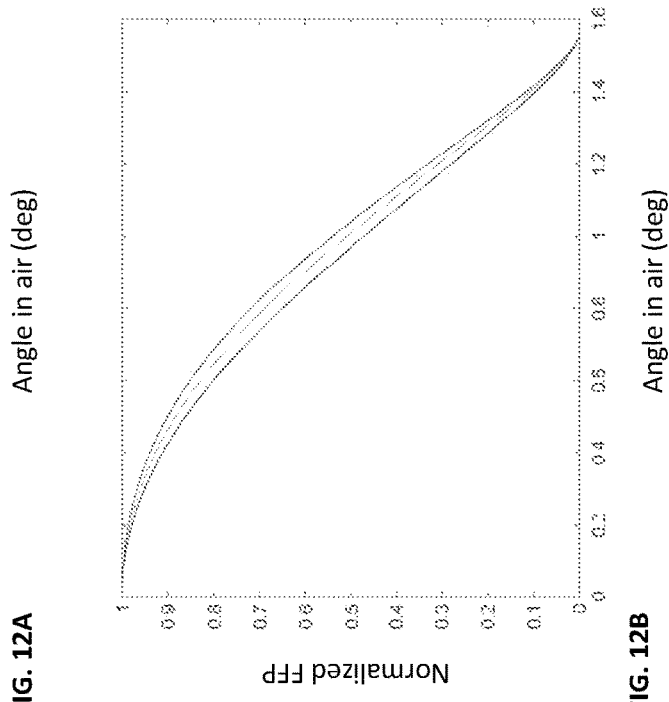
FIG. 12D

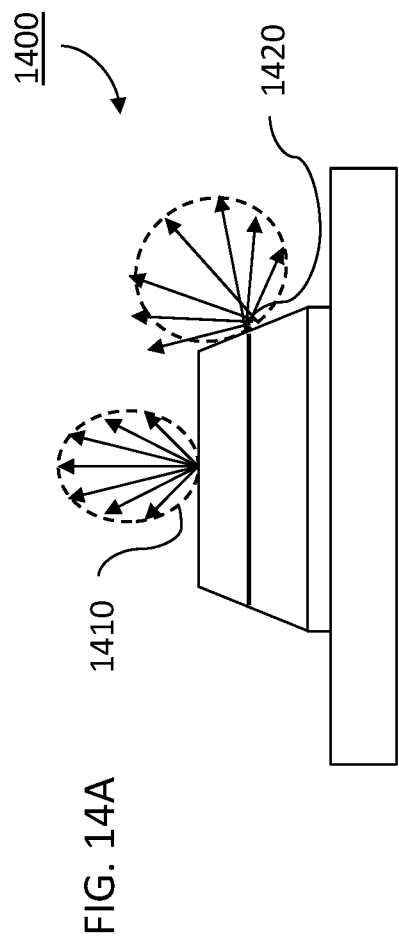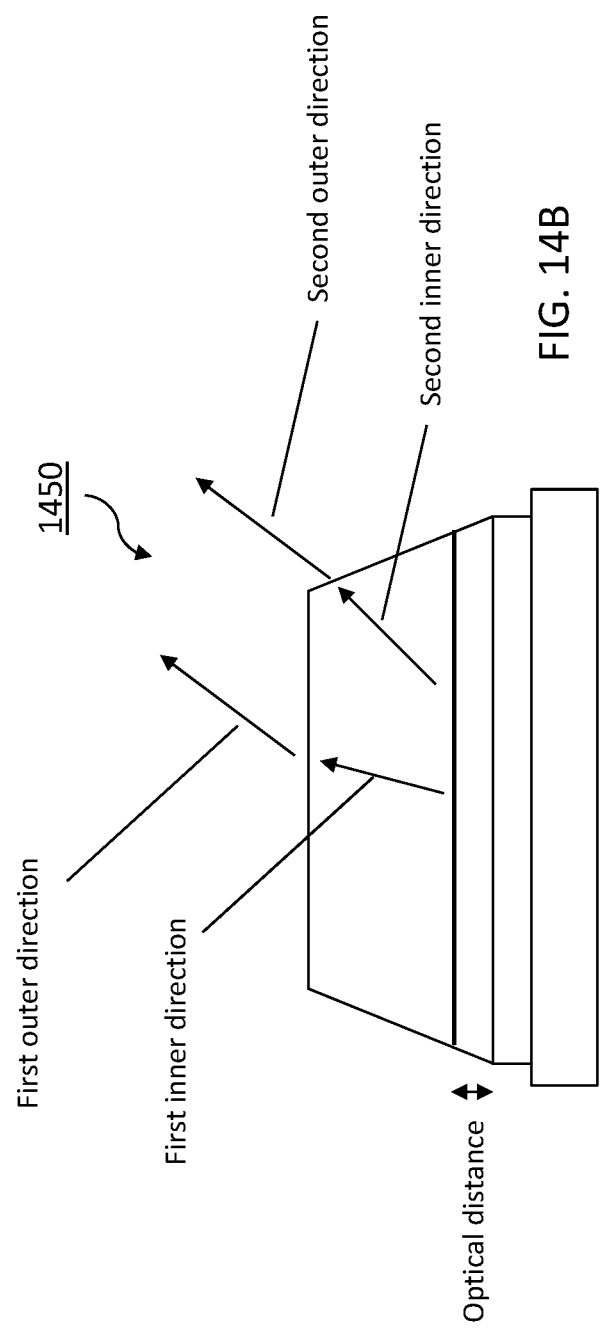

LIGHT EMITTING DIODES WITH DIRECTIONAL EMISSION AND DISPLAYS INCLUDING THE SAME

CROSS-REFERENCE TO RELATED APPLICATION

This application is a National Stage Application under 35 U.S.C. § 371 and claims the benefit of International Application No. PCT/US2020/029016, filed on Apr. 20, 2020. The disclosure of the prior applications is considered part of and is incorporated in its entirety by reference in the disclosure of this application.

FIELD OF THE DISCLOSURE

This disclosure relates to light emitting diodes (LEDS), and more particularly to nanowire (NW) LEDS with directional emission.

BACKGROUND

Nanowires (NWs) are elongate nanostructures having a short dimension on the order of nanometers to hundreds of nanometers (e.g., 1,000 nm or less) and a long dimension significantly longer (e.g., an aspect ratio of 5 or more) extending along an axis. Nanowire light emitting diodes (NW LEDs) typically include many wire-shaped LEDs, typically with a diameter of about 10-1,000 nm and a length of about 100-10,000 nm.

SUMMARY OF THE DISCLOSURE

The far-field pattern (FFP) of an LED is the light intensity emitted at various angles, and is denoted herein as $I(\theta)$. In conventional LEDs, the FFP is approximately Lambertian (i.e., $I(\theta) \sim \cos(\theta)$), with light emitted in a wide range of angles. However, some applications (including displays) may benefit from directional emission, wherein the FFP directs more light in specific angles—for instance, in a narrow angular range near the normal direction. It may be desirable to affect the FFP at the LED level (without the use of additional optics). Further, if directionality is achieved, it can come at the cost of color uniformity over angle (because red, green and blue pixels may have different directionalities), and avoiding this is desirable.

This application discloses LEDs having an optical structure which facilitates a directional FFP, and directional LEDs with good color uniformity.

Various aspects of the invention are summarized as follows.

In general, in a first aspect, the invention features a full color display including multiple pixels, the display having a white point, a direction of emission and a solid angle of emission around the direction of emission characterized by a half-cone angle $\theta$. Each pixel includes: a red sub-pixel including a red LED (e.g., one or more red LEDs) having a first geometry configured to emit red light into a range of emission angles, such that a fraction of the red sub-pixel's power emitted within the solid angle of emission is at least $1.2*(1-\cos(\theta)^2)$; a green sub-pixel including a green LED (e.g., one or more green LEDs) having a second geometry configured to emit green light into a range of emission angles, such that a fraction of the green sub-pixel's power emitted within the solid angle of emission is at least $1.2*(1-\cos(\theta)^2)$; and a blue sub-pixel including a blue LED (e.g., one or more blue LEDs) configured to emit blue light into a range of emission angles, such that a fraction of the blue sub-pixel's power emitted within the solid angle of emission is at least $1.2*(1-\cos(\theta)^2)$. The red, green, and blue LEDs are configured such that, in any direction within the solid angle of emission, white light emitted by the display has a chromaticity difference Du'v' from the white point of the display which is less than 0.01.

Embodiments of the full color display can include one or more of the following features and/or features of other aspects. For example, each of the blue, green, and red LEDs respectively can include a light emitting region and a reflective region located an optical distance less than 1 µm from the active region, such that optical interference within each LED causes light to be emitted in a preferential direction in a far field, wherein the respective optical distances between the light emitting region and the reflection region of the red, greed and blue LEDs are configured such that the respective preferential directions of emitted light from the red, green, and blue LEDs are within +/−10° of each other (e.g., within +/−5° of each other, within +/−3° of each other).

Each blue LED can include a blue light-emitting region emitting light at a blue wavelength, and a blue reflective region separated from the blue light-emitting region by a first optical distance. The green LED can include a green light-emitting region emitting light at a green wavelength, and a green reflective region separated from the green light-emitting region by a second optical distance. The red LED can include a red light-emitting region emitting light at a red wavelength, and a red reflective region separated from the red light-emitting region by a third optical distance. A ratio between the first optical distance and the blue wavelength, a ratio between the second optical distance and the green wavelength, and a ratio between the third optical distance and the red wavelength are all within 10% of each other (e.g., within 5%, within 3%).

Each LED can have a characteristic lateral dimension of 50 µm or less. In some embodiments, at least one of the red, green, and blue LEDs is a multi-facet LED which comprises atop facet and several sidewall facets, wherein during operation of the multi-facet LED light is emitted from each facet, and a cumulative surface area of the sidewall facets is at least 20% of a surface area of the top facet. At least 20% of the light emitted by the multi-facet LED can be emitted through the sidewall facets. Light emitted from the top facet can be preferentially emitted in at first angle with respect to the top facet, light emitted from one of the sidewalls is preferentially emitted at a second angle with respect to the top facet, and the first and second angles are within +/−10° of each other.

In some embodiments, $\theta$ is in a range from 5° to 45°.

The red, green, and blue LEDs can each be characterized by respective shapes such that, in any direction within the solid angle of emission, white light emitted by the display has the chromaticity difference Du'v' from the white point of the display less than 0.01.

The red, green, and blue LEDs can be respectively characterized by a physical dimension and by an emission wavelength, and a ratio between the physical dimension and the emission wavelength for each LED are within +/−10% of each other. The ratio for each LED can be approximately equal. The physical dimension can be selected from the group of: radius, height, characteristic vertical dimension, characteristic horizontal dimension, and optical distance between a light-emitting region and a reflector of the LED.

In certain embodiments, the white point has a chromaticity which is substantially equal to D65.

Each LED can include a metal-based mirror, and can be configured substantially according to an equation $\varphi+4\pi d \cos(\theta)/\lambda = m*2*\pi$, where $\varphi$ is a phase shift characterizing an interface between the metal-based mirror and an adjacent layer of the LED, d is an optical thickness between the interface and a light-emitting region of the LED, $\theta$ is an angle in a range from 0° to 30°, and m is an integer in a range from 1 to 3. The optical thickness between the interface and the light emitting region, d, can be within 10 nm of satisfying the equality.

In general, in another aspect, the invention features a light emitting element extending along an axis, including: a n-side portion having one or more layers of n-doped material; a p-side portion having one or more layers of p-doped material; one or more light emitting layers arranged between the n-side portion and the p-side portion, the one or more light emitting layers being configured to emit light at a wavelength $\lambda$ during operation of the light emitting element; and an electrically conducting layer in contact with the p-side portion, the electrically conducting layer having a reflectance of 80% or more at $\lambda$. The light emitting element has physical dimensions such that light emitting element supports at least two guided modes for light at $\lambda$ propagating along the axis, and the p-side portion has an optical thickness along the axis selected to preferentially enhance emission of the light at $\lambda$ in the first mode compared to emission of the light at $\lambda$ in the second mode.

Embodiments of the light emitting element can include one or more of the following features and/or features of other aspects. For example, the light emitting element can be configured substantially according to the equation $\varphi+4\pi d \cos(\theta)/\lambda = m*2*\pi$, where $\varphi$ is a phase shift characterizing an interface between the electrically conducting layer and the p-side portion, d is the optical thickness of the p-side portion, $\theta$ is an angle in a range from 0° to 30°, and m is an integer in a range from 1 to 3.

The electrically-conductive layer can include silver, and the light emitting device can be further configured such that d/$\lambda$ is in a range 0.55-0.70, where d is an optical thickness of the p-side portion.

The optical thickness of the p-side portion along the axis can be selected to result, for light at $\lambda$ in the first mode, in constructive interference between the light emitted from the one or more light emitting layers propagating towards the n-side portion and the light emitted from the one or more light emitting layers propagating towards the p-side portion that is reflected from the electrically conducting layer.

The light emitting element is a nanowire light emitting diode (NW LED).

The one or more layers of n-doped material can include a layer of n-GaN.

The one or more layers of p-doped material can include a layer of p-GaN.

The one or more layers of n-doped material can include a layer of n-TCO.

The one or more layers of p-doped material can include a layer of p-TCO.

The one or more light emitting layers can include one or more Quantum Well (QW) layers. For example, the one or more light emitting layers can include three to eight QW layers.

The light emitting element can emit the light from an end of the light emitting element opposite the electrically conducting layer.

The electrically conducting layer can include a metal. The metal can be selected from the group of gold, silver, and aluminum.

The light emitting element can include a second electrically conducting layer in contact with the n-doped portion.

$\lambda$ can be a visible wavelength.

The light emitting element can have an axial dimension in a range from 0.5 μm to 5 μm and a maximum lateral dimension orthogonal to the axis in a range from 0.05 μm to 0.5 μm.

The light emitting element can support fewer than 5 guided modes.

In a further aspect, the invention features a light emitting device, including: multiple of the light emitting elements each configured to emit light at a common peak wavelength $\lambda_1$ in a common direction and a common angular range, the light emitting elements being spaced apart from each other by a distance in a range from 0.05 μm to 1 μm.

The light emitting device can include multiple second light emitting elements, each configured to emit light at a common peak wavelength $\lambda_2$ in the common direction and the common angular range, where $\lambda_2$ is different from $\lambda_1$. The light emitting device can include multiple third light emitting elements, each configured to emit light at a common peak wavelength $\lambda_3$ in the common direction and the common angular range, where $\lambda_3$ is different from $\lambda_1$ and $\lambda_2$. The light emitting device can include multiple pixels, each pixel having at least three subpixels, a first of the subpixels having the first plurality of light emitting elements, a second of the subpixels having the second plurality of light emitting elements, and the third subpixel having the third plurality of light emitting elements.

In general, in another aspect, the invention features a full color display including multiple pixels, the display having a white point, each pixel including: a red sub-pixel having a plurality of nanowire light emitting diodes (NW LEDS) configured to emit red light into a range of emission angles, 45% or more of an intensity of the red light being emitted into an angular range along a first direction and subtending a solid angle of 30°; a green sub-pixel having a plurality of NW LEDS configured to emit green light into a range of emission angles, 45% or more of an intensity of the green light being emitted into the angular range; and a blue sub-pixel having a plurality of NW LEDS configured to emit blue light into a range of emission angles, 45% or more of an intensity of the blue light being emitted into the angular range. Within the angular range, white light emitted by the display has a chromaticity difference Du'v' from a white point of the display which is less than 0.01. Embodiments of the full color display can include one or more of the features of other aspects.

In general, in yet another aspect, the invention features a full color display including multiple pixels, the display having a white point, a direction of emission and a solid angle of emission around the direction of emission characterized by a half-cone angle $\theta$, each pixel including: a red sub-pixel having a plurality of red nanowire light emitting diodes (NW LEDS) configured to emit red light into a range of emission angles, such that a fraction of the red sub-pixel's power emitted within the solid angle of emission is at least $1.2*(1-\cos(\theta)^2)$; a green sub-pixel having a plurality of green NW LEDS configured to emit green light into a range of emission angles, such that a fraction of the green sub-pixel's power emitted within the solid angle of emission is at least $1.2*(1-\cos(\theta)^2)$; and a blue sub-pixel having a plurality of blue NW LEDS configured to emit blue light into a range of emission angles, such that a fraction of the blue sub-pixel's power emitted within the solid angle of emission is at least $1.2*(1-\cos(\theta)^2)$. The NW LEDs are configured such that, in any direction within the solid angle of emission, white light emitted by the display has a chromaticity difference Du'v' from a white point of the display which is less than 0.01.

Embodiments of the full color display can include one or more of the following features and/or features of other aspects. For example, θ is in a range from 5° to 45°.

The red, green, and blue LEDs can each be characterized by respective shapes such that, in any direction within the solid angle of emission, white light emitted by the display has the chromaticity difference Du'v' from the white point of the display less than 0.01.

The red, green, and blue LEDs can be respectively characterized by a physical dimension and by an emission wavelength, and a ratio between the physical dimension and the emission wavelength for each LED are within +/−10% of each other. In some embodiments, the ratio for each LED is approximately equal. The physical dimension can be selected from the group of: radius, height, characteristic vertical dimension, characteristic horizontal dimension, and optical distance between a light-emitting region and a reflector of the LED.

The white point can have a chromaticity which is substantially equal to D65.

Each LED can include a metal-based mirror, and can be configured substantially according to an equation $\varphi + 4 \pi d \cos(\theta)/\lambda = m \cdot 2 \cdot \pi$, where $\varphi$ is a phase shift characterizing an interface between the metal-based mirror and an adjacent layer of the LED, d is an optical thickness between the interface and a light-emitting region of the LED, θ is an angle in a range from 0° to 30°, and m is an integer in a range from 1 to 3. The optical thickness between the interface and the light emitting region, d, can be within 10 nm of satisfying the equation.

Other aspects and advantages will be apparent from the description, the drawings, and the claims.

BRIEF DESCRIPTION OF THE DRAWINGS

FIG. 2A is a schematic cross-sectional diagram of an example NW LED.

FIG. 2B is a schematic cross-sectional diagram of another example NW LED.

FIG. 2C is a schematic cross-sectional diagram of a further example NW LED.

FIG. 5A is a plot showing an example emission profile from a NW LED.

FIG. 5B is a plot showing another example emission profile from a NW LED.

FIG. 5C is a plot showing a further example emission profile from a NW LED.

FIG. 5D is a plot showing yet a further example emission profile from a NW LED.

FIG. 10A is a plot showing example spectral output for red, green, and blue LEDs that provide a D65 white point when appropriately mixed.

FIG. 10B is a plot showing far field emission as a function of angle for example red, green, and blue NW LEDs.

FIG. 10C is a plot showing far field emission as a function of angle for another example red, green, and blue NW LEDs.

FIG. 10D is a plot showing white point locus as a function of angle for the NW LEDs shown in FIG. 10B.

FIG. 10E is a plot comparing Du'v' as a function of angle for the systems corresponding to FIG. 10B and FIG. 10C.

FIG. 12A is a plot comparing normalized far field emission for an example red, green, and blue LEDs as a function of angle.

FIG. 12B is a plot comparing Du'v' as a function of angle for two different systems.

FIG. 12C is a plot comparing normalized far field emission for another example red, green, and blue LEDs as a function of angle.

FIG. 12D is a plot comparing Du'v' as a function of angle for the two different systems over a smaller angular range than FIG. 12B.

FIG. 14A is a schematic cross-sectional view of an example multi-faceted LED.

FIG. 14B is a schematic cross-sectional view of another example multi-faceted LED.

DETAILED DESCRIPTION

Nanowire (NW) LEDs offer opportunities for directional emission. The far field pattern (FFP) of light emission from a NW LED can be affected by a variety of different effects—including individual and collective effects. Individual effects include the influence of a single NWs optical design on its emission properties. Collective effects include the interaction of light emitted from an NW with other surrounding NWs, including diffraction effects by a plurality of NW. Embodiments disclosed here can harness individual and/or collective effects to achieve a directional FFP.

Figure 1A:
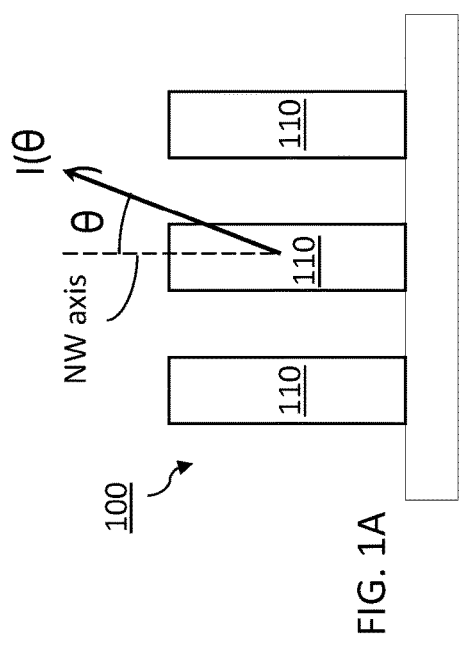
FIG. 1A is a schematic diagram illustrating emission from a nanowire (NW) LED in an array of NW LEDs.

A directional FFP can be quantified by the fraction of the total emission directed in a specific angular range. FIG. 1A schematically shows an array 100 of NW LEDs 110 arranged in a plane and an emission I(θ) for a given NW LED measured as a function θ normal to the plane.

Figure 1B:
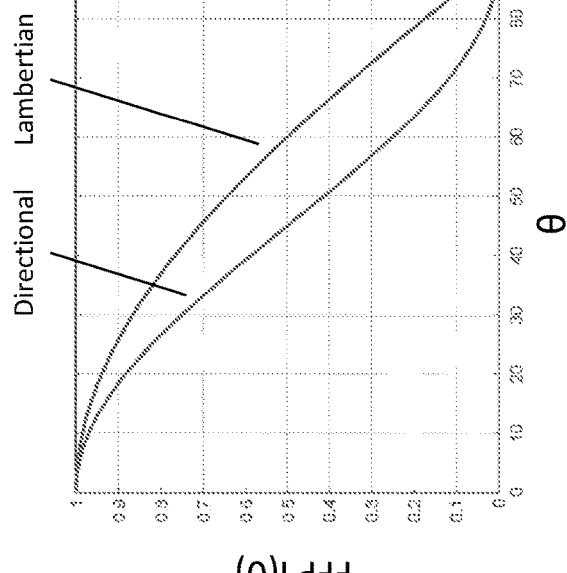
FIG. 1B is a plot comparing relative emission intensity from an example directional emitter and a Lambertian emitter at emission angles from 0° to 90°.

FIG. 1B is a plot comparing emission from two examples of FFPs. The vertical axis is the intensity of the FFP, normalized to the peak emission at θ=0°. A Lambertian FFP I(θ)~cos(θ) is common for conventional LEDs. An example directional NW LED can achieve FFP I(θ)~cos(θ)$^2$, achieving better directionality near normal incidence than the Lambertian FFP.

Figure 1C:
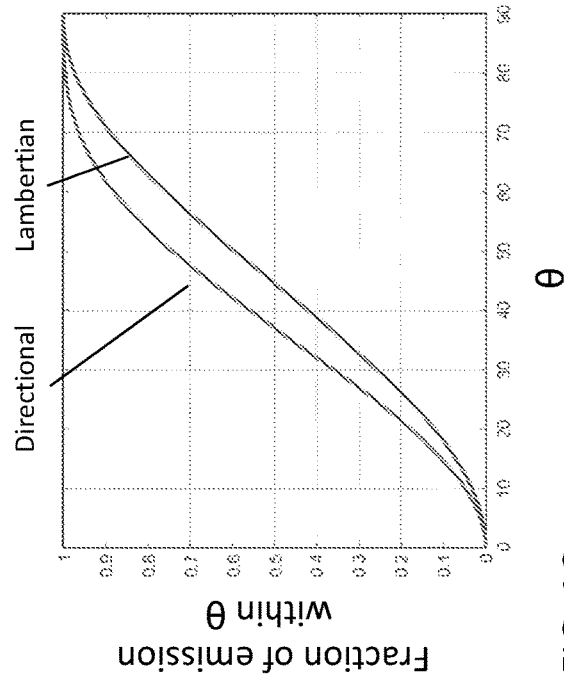
FIG. 1C is a plot comparing the fraction of emission from an example directional emitter and a Lambertian emitter at emission angles from 0° to 90°.

FIG. 1C is a plot showing the fraction of the total emission between normal incidence and a given angle for the example directional and Lambertian FFPs of FIG. 1B. For the Lambertian FFP, 25% of the emission is within 30°, whereas for the directional FFP, 35% of the emission is within 30°.

Figure 1D:
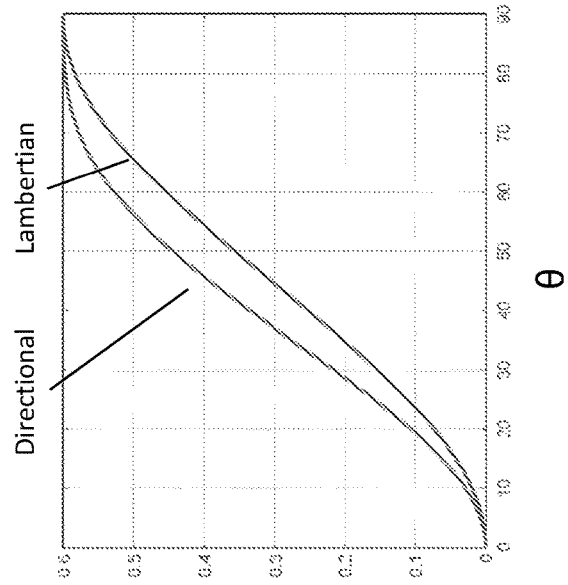
FIG. 1D is a plot comparing light extraction with an emission angular range from an example directional emitter and a Lambertian emitter at emission angles from 0° to 90°.

A directional FFP can also be quantified by the absolute extraction efficiency in a specific angular range (where the extraction efficiency is the ratio of light emitted outside the LED to light emitted inside the LED). FIG. 1D is a plot showing the extraction efficiency versus angular range for the two previous FFPs, assuming that in both cases the LEDs have a total extraction efficiency of 60%. For the Lambertian FFP, the extraction within 30° is 15%. For the directional FFP, the extraction within 30° is 22%.

Thus in the example of FIGS. 1A-1D, the directional FFP achieves a relative directionality improvement of 40% versus a Lambertian emitter in the range 0-30°. Some embodiments are characterized by such a directionality enhancement against a Lambertian emitter. Table 1 shows, for certain embodiments, values of the enhancement and the fraction of emission within an angular cone, for various angular ranges. Some embodiments achieve at least such enhancements and such fractions of emission in an angular cone.

| Angle range | Enhancement vs. Lambertian | Fraction of emission in cone |
|---|---|---|
| 0-20° | 20% | 14.5% |
| 0-20° | 50% | 18% |
| 0-20° | 100% | 24% |
| 0-30° | 20% | 30% |
| 0-30° | 40% | 35% |
| 0-30° | 60% | 40% |
| 0-45° | 10% | 55% |
| 0-45° | 20% | 60% |
| 0-45° | 30% | 65% |

Individual Effects on Directionality

In some embodiments, the optical design of a NW emitter is configured to affect its directionality. The optical design refers to the geometry of the NW LED, including its height, lateral dimensions/diameter, tapering, shape of cross section (e.g., circle, hexagon . . . ), etc. It further includes the thickness and refractive index of various layers composing in the NW LED.

An example NW LED includes an active region having one or more light-emitting layers (e.g., quantum wells or double heterostructures). Hereafter, III-nitride LEDs will be discussed, although other material systems can be considered. An example III-nitride NW epitaxial stack may be as follows (starting from a growth substrate): an n-GaN layer; a InGaN underlayer (e.g., bulk or superlattice, possibly n-doped); a GaN lower spacer layer (e.g., undoped and/or n-doped); the active region, such as a QW/barrier stack (e.g., undoped); a GaN lower spacer layer (e.g., undoped and/or p-doped); a AlGaN electron blocking layer (e.g., p-doped); and a p-GaN layer.

Generally, the growth substrate can be sapphire, silicon, SiC, freestanding GaN, a GaN or InGaN buffer grown on another material. The growth substrate can be patterned with a mask to facilitate the growth of NW in the mask opening. After growth, the NW may be transferred to a submount member (e.g., with either the n-side or the p-side of the NW being towards the submount), and the substrate may be removed. N-type and p-type contacts are formed to the NW. Often, several NWs are contacted together in parallel to form an LED. The LED can form a subpixel of a display system.

Some embodiments resort to optical interference caused by the p-contact to affect the FFP. In some embodiments, light emitted by the active region is reflected by the p-contact, causing the interference. The thickness and refractive index of various layers may be configured to control this interference, as will be discussed below.

In some embodiments, the p-contact can include a highly reflective metallic layer, including Ag and/or Al. The p-contact may further include a transparent conductive layer (e.g., a transparent conductive oxide (TCO)), for instance between the p-GaN and the metal.

FIG. 2A shows an example structure for a NW LED 200. Specifically, NW LED 200 is a single wire of a NW LED. The NW 200 has epitaxial layers include a p-GaN layer 220, an active region 210, and a n-GaN layer 250, a p-contact composed of a metal layer 240 and a TCO layer 230, and an n-contact composed of another TCO layer 255. The contacts may further extend laterally and contact other NWs in an array of NWs of a NW LED.

Other example partial structures for NWs are shown in FIGS. 2B and 2C, having different layers for the p-contact structures compared to NW 200. For example, in some cases, the p-contact includes at least one layer 280 of Ag which is at least 50 nm (e.g., 100 nm or more, 200 nm or more)-thick, to provide sufficient reflectivity. Layer 280 can include metals in addition to Ag, e.g., alloyed with the Ag. The additional metals can be present in small traces (e.g., by doping or diffusion), present as thin layers in the Ag layer (either in the bulk of this layer or at its surface). The structure shown in FIG. 2B also includes an interface layer 270 present at the Ag/semiconductor interface. The interface layer 270 can be a thin layer of another metal (e.g., Ti, Al, Ni, Pt) and may facilitate a low contact resistance. The interface layer 270 can have a thickness of 10 nm or less (e.g., 3 nm or less, 10 A or less, 3 A or less, such as 1 A). It can be an alloy layer of Ag and another layer. The interface layer 270 can be deposited or diffused to the Ag/semiconductor interface.

In these various embodiments, a sufficient reflectivity of light emitted by the NW is desirable. In some embodiments, the single-bounce reflectivity at normal incidence of the contact stack for light emitted by the active region is 80% or more (e.g., 85% or more, 90% or more, 93% or more, 95% or more, 97% or more, such as 99% or more). The interface layer 270 can be configured to ensure such reflectivity, e.g., by ensuring the interface layer is sufficiently thin to limit its absorption. The stack shown in FIG. 2B also includes a metal stack 285 between the Ag layer 280 and the submount 260. This stack may provide various functions (e.g., encapsulation, diffusion barrier, adhesion, thermal conduction, mechanical compliance) and can include Ag, Al, Au, Ni, Ti, Pt, Sn, Cu, and other metals.

FIG. 2C shows an alternative metal stack, where a TCO layer 258 (such as ITO, ZNO, IZO, CuO or other TCOs) is further present between the interface layer 270 and the semiconductor layer 220.

In embodiments with a metal layer, the p-contact acts as a mirror which gives rise to interference between light reflected by the mirror and light emitted by the active region 210. FIG. 2A illustrates such interference: light emitted downward from active region 210 (in the p-direction) is reflected upward by metal layer 240, and interferes with light emitted upward from active region 210 (in the n-direction). Such a geometry can be called a half-cavity geometry, because the interference is only caused by one mirror (compared to two mirrors in a conventional cavity).

Without wishing to be bound by theory, in the following, we first discuss half-cavity interference in the case of a planar geometry, i.e., for an LED having infinite lateral extent, before discussing embodiments in NW LEDs.

An important parameter for interference is the optical thickness between the active region and the mirror. In this disclosure, d1 designates the optical thickness between the top of the active region and the p-mirror and dc designates the optical thickness between the center of the active region and the p-mirror. FIG. 2A illustrates the d1 and dc for NW 200. For clarity, the optical thickness is the product of physical thickness and refractive index at a wavelength of interest (e.g., the peak emission wavelength of the active region). For instance, for an epitaxial stack having layers given in the table below (with the refractive index at the wavelength of interest):

| Layer name | material | Thickness (nm) | Refractive index |
| --- | --- | --- | --- |
| p-metal | Ag | 100 | 0.05 + 2.5*i |
| ITO spacer | ITO | 50 | 1.8 |
| p-GaN | GaN | 100 | 2.5 |
| Active region | GaN/InGaN | 40 | 2.6 |

The optical thicknesses d1 and dc are as follows:

$$d1 = 100 \times 2.5 + 50 \times 1.8 = 340 \text{ nm}$$

$$dc = 20 \times 2.6 + 100 \times 2.5 + 50 \times 1.8 = 392 \text{ nm}$$

d1 can be a useful quantity to characterize optical interference for light emitted by the top (p-side) of the active region; dc can be a useful quantity to characterize optical interference for light emitted by the middle of the active region. In some embodiments, the majority of the light is emitted near the top of the active region (e.g., by the p-side QWs); in some embodiments, light is emitted across the active region and dc approximately characterizes the center of the emission. In some embodiments, the active region is thin (e.g., less than 10 nm) and d1 and dc are practically equal. Light propagating from active region 210 and reflected by the mirror (metal layer 240) undergoes a phase shift proportional to d1/dc. The metal of the mirror further induces a phase shift (e.g., if the mirror is Ag-based, it can induce a phase shift of approximately $-\pi/2$). The total phase shift for emitted light is then the sum of the phase shift due to propagation in the transparent layers, and the reflection at the mirror. Depending on the value of this total phase shift, constructive or destructive interference may occur in a given direction.

Figure 3B:
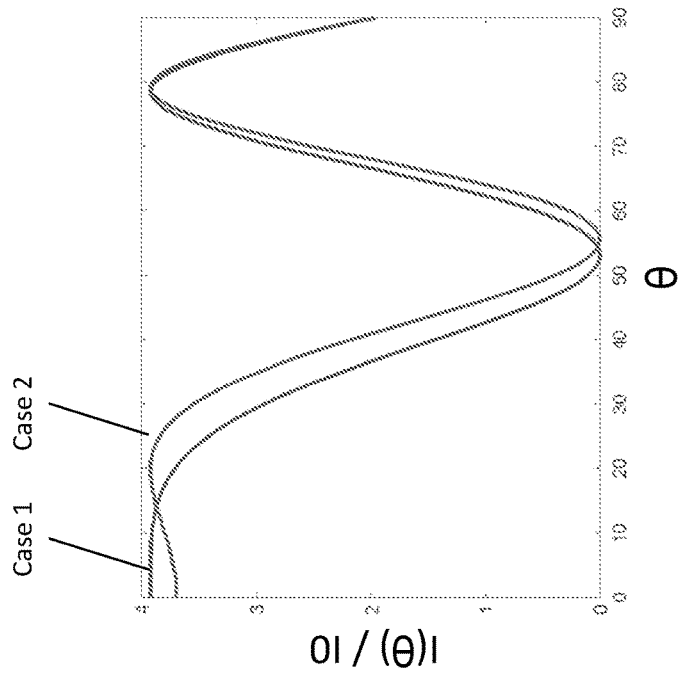
FIG. 3B is a plot showing emission intensity as a function of angle for two example NW structures in which interference effects occur.
Figure 3A:
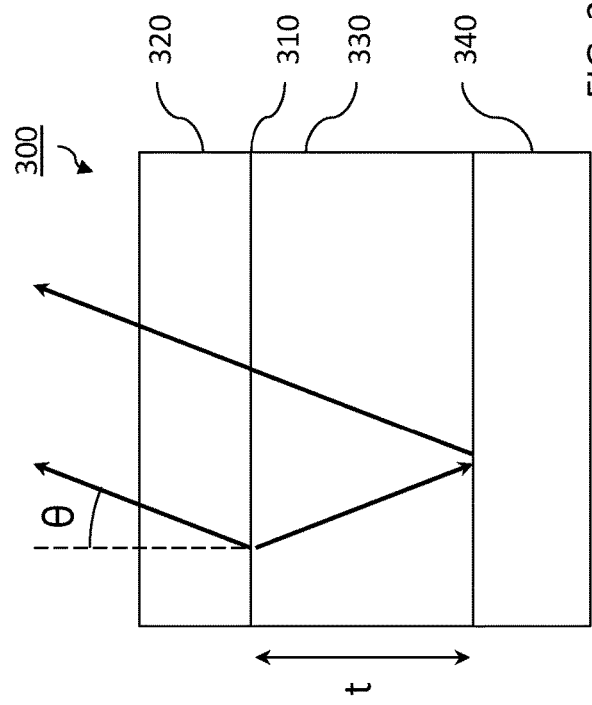
FIG. 3A is a schematic cross-sectional diagram of an example NW LED showing ray paths of light emitted by the LED.

FIG. 3A illustrates the cumulative phase shift from propagation within layers 330 of a NW 300 due to reflection from a mirror 340. In this example, NW layers 320 and 330 have a constant refractive index n and a light emitting layer 310 is located at a distance t from the mirror 340 (in this case, the optical thickness is $d1 = n \cdot t$).

The electric field emitted in direction $\theta$, due to the interference between the two waves, is $E = E0(1 + |r| \exp i[\varphi + 2 n k t \cos(\theta)])$, where $E0$ is the intensity of the emitted field in a bulk medium, $r = |r| \exp i\varphi$ is the mirror reflectivity, $k = 2\pi/\lambda$ with $\lambda$ the wavelength of emission, t is the thickness between the light-emitting layer 310 and the mirror 340, and $\theta$ is the angle of emission. Constructive interference occurs in a given direction when the total phase shift is: $\varphi + 2 n k t \cos(\theta) = m \cdot 2 \cdot \pi$, with m an integer. In this case, the material is homogeneous and the optical distance d1 is simply equal to $n \cdot t$.

The emitted intensity $I(\theta)$ is the square of the electric field E. It can reach a maximum enhancement of 4 (constructive interference) and a minimum value of 0 (destructive interference) if the mirror is perfect (i.e., $|r| = 1$).

FIG. 3B is a plot that illustrates $I(\theta)$ resulting from such interference, for a GaN LED (n=2.5) with an Ag mirror. $I(\theta)$ is normalized by I0 (the value in a bulk material). Therefore, a value $I(\theta) = 2$ means that the intensity of emission is enhanced two-fold by interference effects.

Two example values of t are considered for this plot. Case 1: when t=112 nm, constructive interference occurs in the vertical direction, with a value of nearly 4. Case 2: when t=120 nm, constructive interference occurs at $\theta = 20°$.

Figure 3C:
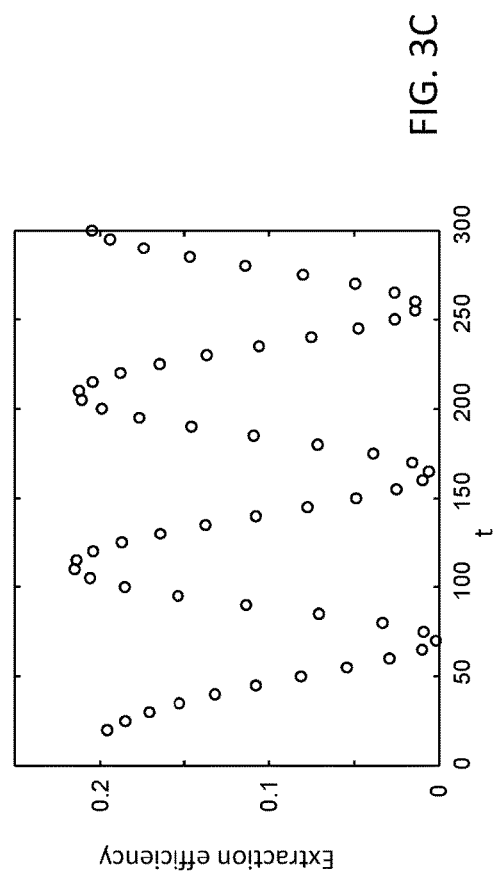
FIG. 3C is a plot showing the total extraction efficiency into air as a function of a thickness separating an active region and a mirror.

FIG. 3C shows the net extraction efficiency resulting from this interference effect. FIG. 3C is a plot of the total extraction into air as a function of the thickness t, for the same LED as in FIGS. 3A-B. The extraction oscillates with t, with a period $\lambda/2n$ (which is about 90 nm). In this example, an extraction efficiency into air higher than 20% can be achieved with perfect tuning of t. If a specific directionality is sought, the optimal value of t may vary; the extraction efficiency may be above 10% (e.g., 15% or more, 20% or more). Other designs can facilitate even-higher extraction efficiency (e.g., 30% or more, 40% or more, 50% or more).

In a more complex structure where the index is not homogeneous, the term $t \cdot n$ should be replaced by the optical thickness d1 (or dc respectively), and the condition of constructive interference at normal incidence is: $\varphi + 2 d1 k = m \cdot 2 \cdot \pi$.

In summary, by configuring the optical design of the half-cavity, interference can enhance or suppress emission in some directions. Configuration of the optical design may include: selecting thicknesses and refractive indices of layers; selecting a metal mirror with desired reflectivity and/or phase shift; configuring an optical thickness to cause interference in a direction; configuring a contact with a metallic reflector and a TCO layer; selecting the radius or shape of a NW; and other means known in the art. In some embodiments, configuring the optical design include selecting an angle, and configuring an optical length for light reflected by a mirror to obtain constructive or destructive interference at said angle.

Some embodiments of the invention make use of such half-cavity interference in NW LEDs. Light emission in this case is more complex than the simple planar geometry, and will now be discussed.

Figure 4B:
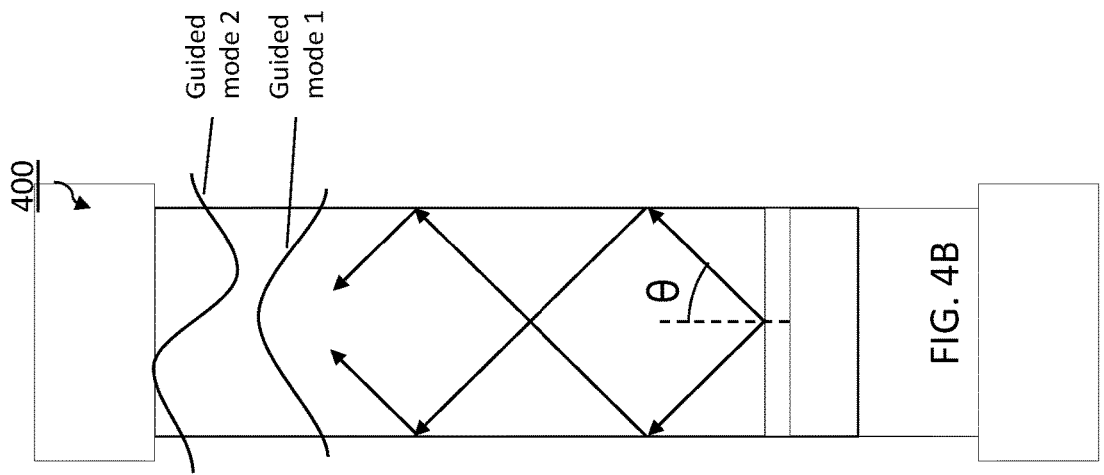
FIG. 4B is a schematic cross-sectional diagram illustrating guided modes within the example NW LED shown in FIG. 4A.
Figure 4A:
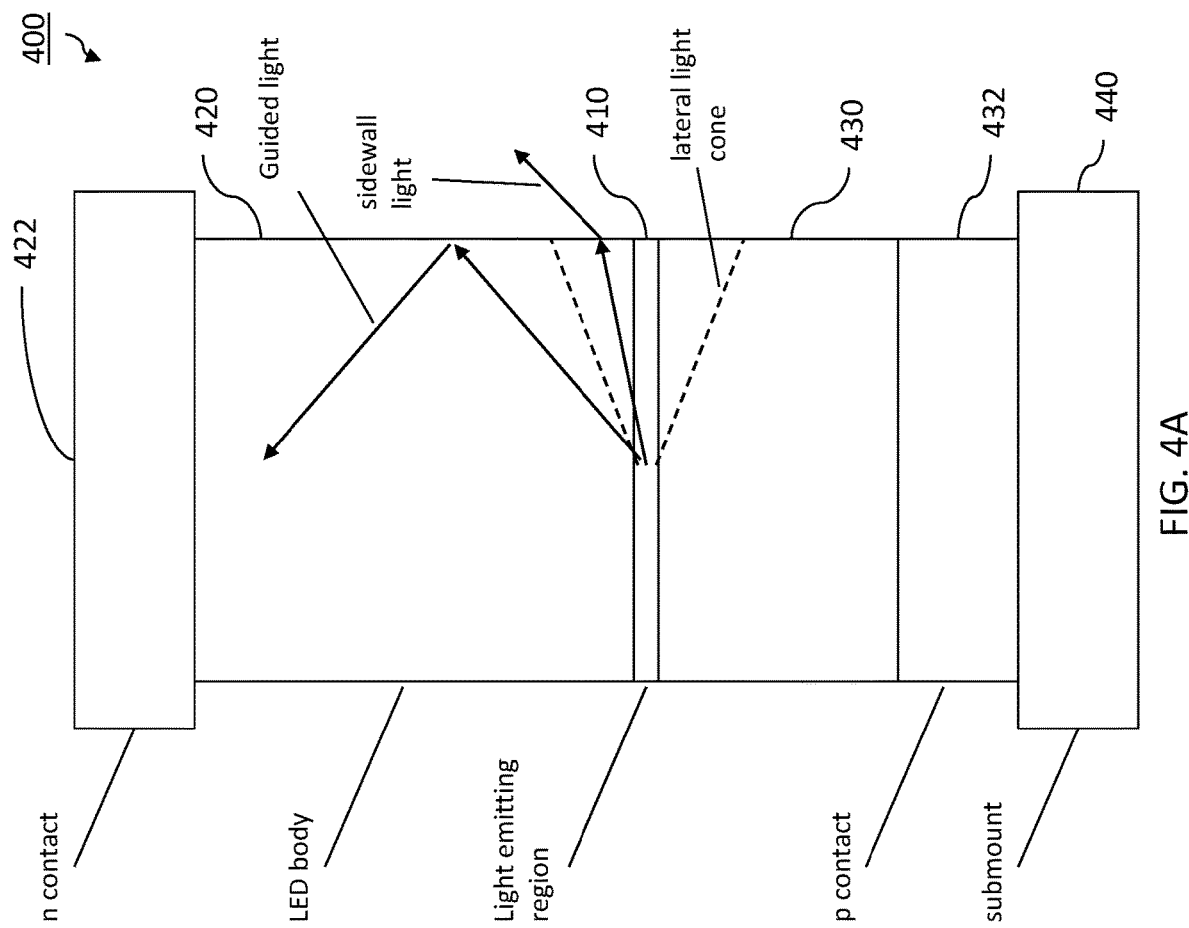
FIG. 4A is a schematic cross-sectional diagram of an example NW LED illustrating guided light and sidewall light trajectories.

FIG. 4A shows two trajectories for light emission in a NW LED 400. In this example, NW 400 includes a submount 440, a p-contact layer 432, a semiconductor layer 430, a light emitting region 410, another semiconductor layer 420, and an no-contact layer 422. Among other trajectories, light emitting region 410 emits light along two different paths into semiconductor layer 420. Light emitted near the horizontal direction can escape from the sidewalls, and will be termed sidewall light. This occurs for light within a sidewall light cone, illustrated by dotted lines in FIG. 4A. The angle of the light cone (counted from the horizontal direction) is asin (n_ext/n_in), with n_ext and n_in the refractive indices of the external medium and LED medium (this expression is true for light emitted from the center of the active region, but can give a correct order of magnitude for other emission positions). Thus if NW 400 is GaN-based (index ~2.5) and the outside medium has an index 1 (resp. 1.5), the angle of the light cone is about 24° (resp. 37°).

On the other hand, light emitted outside the light cone is reflected by the NW sidewall due to total internal reflection, and forms guided light.

FIG. 4B shows guided light bounces several times within layer 420 and forms a guided mode propagating along the axis of NW 400. A variety of modes with different symmetries are possible (e.g., TE, TM, HE and HM symmetries in the case of a circular NW). Each of these modes can be characterized by its propagation angle θ along the NW axis. These guided modes are akin to the modes of an optical fiber. In general, the number of modes increases as the NW radius (or more generally, its lateral dimension) increases.

FIG. 5A shows an example of a resulting emission diagram (i.e., the intensity at which light is emitted by the active region versus angle). In the sidewall light cone, light may be emitted as a broad continuum. Outside the light cone, light is emitted in a series of discrete directions corresponding to guided modes (here mode 1 and mode 2 are shown, with respective propagation angles of about 20° and 45°).

Some embodiments can achieve directionality by selectively exciting some guided modes and/or sidewall light, thanks to interference effects. Selectively exciting means causing a variation (either an increase or a decrease) of the amount of power emitted in a direction.

In some embodiments, sidewall light is not desired because it is emitted near the horizontal direction. The optical design of the NW can be configured to cause destructive interference near the horizontal direction, to suppress such emission. In some embodiments, the optical design is configured to create destructive interference at an angle θ of 90° or 85° or 80° or 75° or 70°, and/or at one or more angles in a range 70°-85°.

FIG. 5B shows another example of an emission diagram in an embodiment where sidewall light emission is suppressed. In some embodiments, the amount of light emitted from the sidewall of a NW LED is 30% or less (e.g., 25% or less, 20% or less, 15% or less, 10% or less, 5% or less).

In some embodiments, selective excitation of some guided mode against other guided modes is sought. For instance, a NW can have a radius which supports two guided modes, propagating at angles θ1 and θ2. The optical design of the NW is configured to cause constructive interference at angle θ1 and/or destructive interference at angle θ2, so that mode 1 is preferentially excited. FIG. 5C shows an example emission diagram for such an embodiment, where emission in mode 2 is suppressed.

FIG. 5D shows an example emission diagram for an embodiment in which mode 2 and sidewall light is suppressed.

The interference patterns illustrated by FIG. 3B may be suitable to achieve such an effect, as they enhance emission at small angles and suppress emission at intermediate angles near 50°. Such selective excitation of guided modes can result in a directional FFP, because some modes are emitted outside the NW in specific directions in the FFP.

In some embodiments, a direction of emission is selected; and the optical design of the NW is configured to obtain constructive or destructive interference in the direction of emission. Embodiments include methods of configuring LEDs as taught herein.

In certain embodiments, a NW supports at least two guided modes. The NW includes a mirror, and optical interference of the emitted light with the mirror suppresses emission into guided modes propagating in a predetermined angular range. In some embodiments, emission is substantially suppressed in a range from 40-50° (and/or 30-40°, 50-60°,60-70°). In some embodiments, 10% or less (e.g., 5% or less, 2% or less) of the total emission is emitted within the suppressed angular range.

In some embodiments, a NW supports at least two guided modes. The NW includes a mirror, and optical interference of the emitted light with the mirror causes 30% or more (e.g., 40% or more, 50% or more, 60% or more, 70% or more) of the total emission to be channeled into one mode; and/or 20% or less (e.g., 10% or less, 5% or less, 2% or less) of the emission to be emitted into the other modes.

In some embodiments, a NW supports at least two guided modes. The NW includes a mirror, and optical interference of the emitted light with the mirror causes selective excitation of a fraction of the modes. This results in a directional FFP, whose directionality may be described by the values of Table 1.

A change in emission into modes may be quantified in absolute terms. In some embodiments, emission enhancement is sought and a mode or a subset of modes is selectively excited and receives 30% or more (e.g., 40% or more, 50% or more, 60% or more, 70% or more) of the total light emitted by the active region. In some embodiments, emission inhibition is sought and a mode or a subset of modes is selectively excited and receives 20% or less (e.g., 10% or less, 5% or less, 2% or less) of the total light emitted by the active region. A change in emission into modes may be quantified by its relative change due to interference. In some embodiments, a mode receives a first emission in the absence of interference (i.e., in an infinite NW having no mirror) and it receives a second emission in the presence of interference (i.e., in the presence of the mirror), and the change in emission is quantified as the ratio of the second emission over the first emission. In some embodiments, emission enhancement is sought and the ratio may be 1.5 or more (e.g., 2 or more, 2.5 or more, 3 or more, 3.5 or more, 4 or more). Ratios above 2 can be non-trivial since they can result from wave interference (as opposed to mere incoherent reflection). In some embodiments, emission inhibition is sought and the ratio may be 1 or less (e.g., 0.8 or less, 0.5 or less, 0.3 or less, 0.2 or less, 0.1 or less, 0.05 or less, 0.01 or less).

In such embodiments, the interference condition may not be strictly given by the phase-matching equations described above: these pertain to a planar system, and the specific optical design causing interference for a mode in a NW will differ slightly. Nevertheless, such optical design can be determined for specific geometries (e.g., by computer simulation including numerical modeling known in the art), given the teachings herein.

In some embodiments, modes with a propagation angle close to the NW axis are preferred, because such modes may have a more directional FFP. In particular, some modes' FFP is approximately maximal at an angle corresponding to their propagation angle (after transformation of the angle to the outside medium by Snell's law). This may especially be the case if the mode's propagation angle places it inside the escape cone for the top surface of the NW.

Figure 6B:
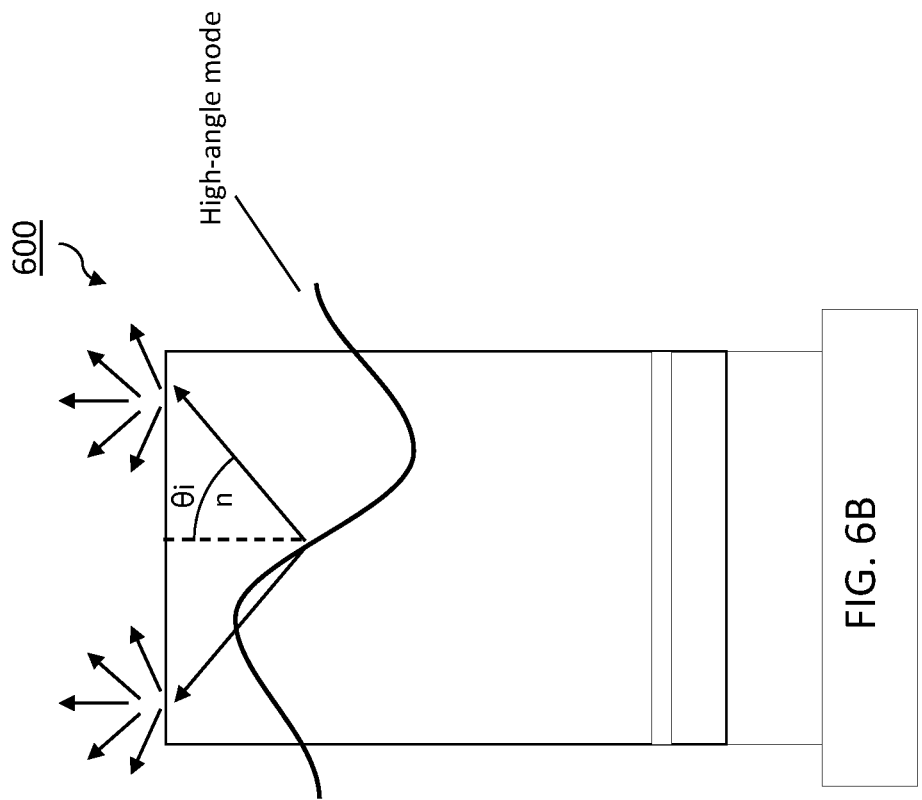
FIG. 6B is a schematic cross-sectional diagram showing emission of a second guided mode in the example NW LED shown in FIG. 6A.
Figure 6A:
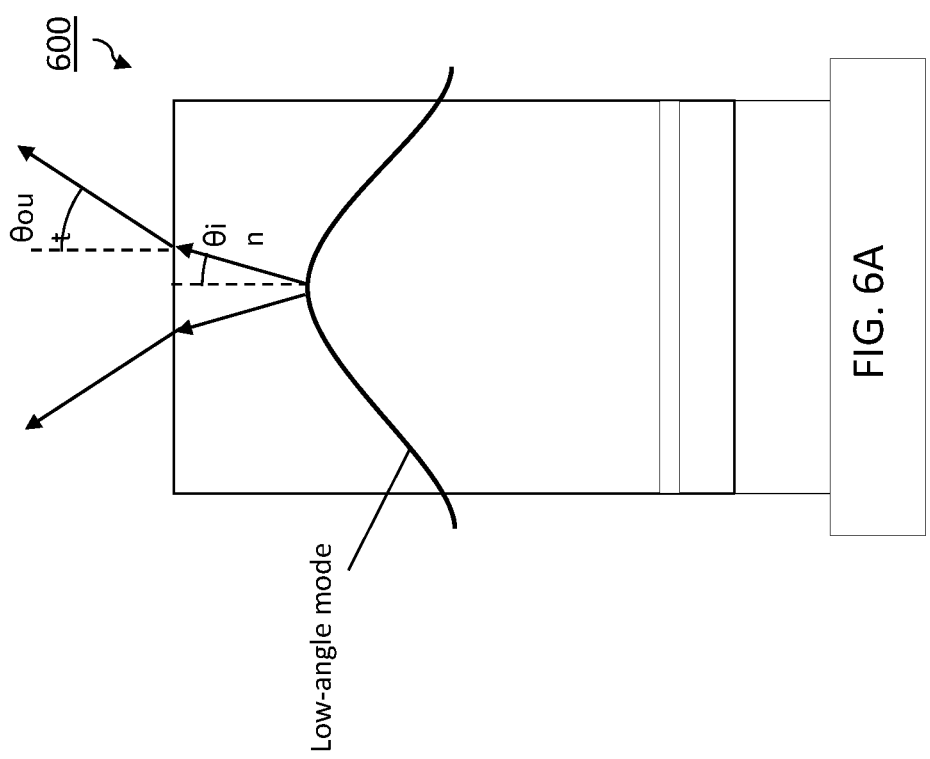
FIG. 6A is a schematic cross-sectional diagram showing emission of a first guided mode in an example NW LED.

This is illustrated in FIGS. 6A and 6B, which illustrate emission from two guided modes of a nanowire 600. In FIG. 6A, a guided mode propagates at a low internal angle θin along the axis of NW 60. This angle is smaller than the critical angle for extraction to the outside medium (e.g., from GaN to air). Upon impinging on the NW top surface, the mode therefore escapes the facet with a good efficiency because its main wavevector can propagate in the outside medium, and the mode's FFP is mainly directed in the external direction θout given by Snell's law (n_in sin θin=n_out sin θout). Such a mode can therefore be harnessed to obtain good directionality.

Figure 7A:
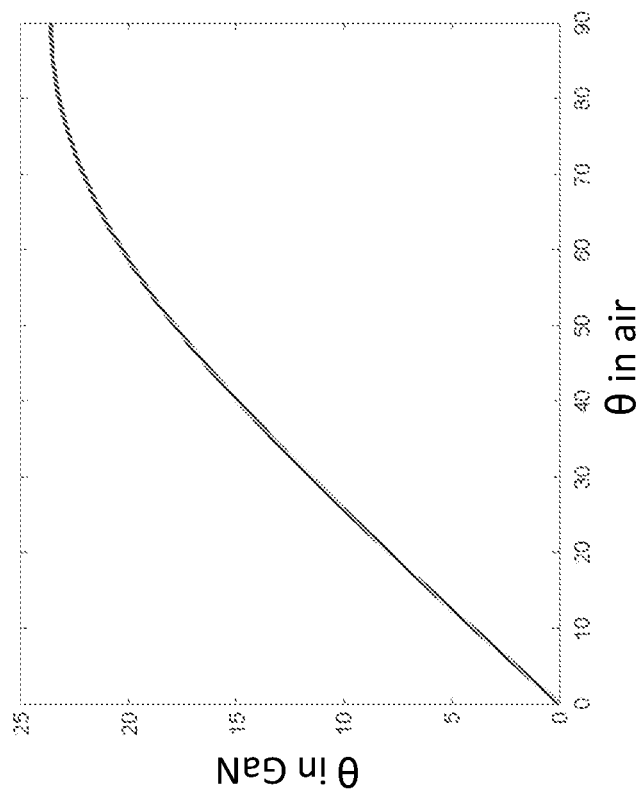
FIG. 7A is a plot illustrating Snells' law in the case of extraction from GaN to air.

FIG. 7A illustrates Snells' law in the case of extraction from GaN to air. For instance, a mode having a propagation angle of 10° (resp. 5°, 7°) in a GaN NW may have a FFP with maximum emission around 25° (resp. 12°, 20°) in air, which may be suited for some applications.

In contrast, FIG. 6B shows a guided mode in NW 600 propagating at a high angle θin, which is larger than the critical angle. Direct extraction of the main wavevector is not possible, and the mode is instead diffracted in various directions. Such a mode may therefore be detrimental to directional emission.

Figure 7B:
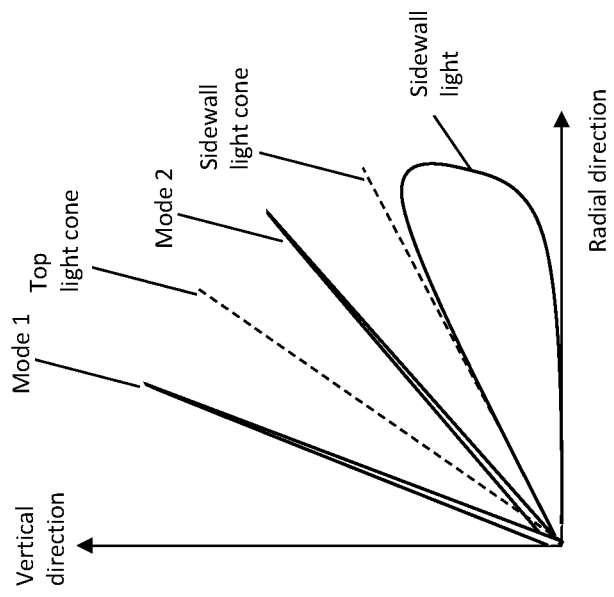
FIG. 7B is a plot showing emission intensity at various angular ranges.

Accordingly, some embodiments can favor emission into low-angle modes. In some embodiments, modes having a propagation angle of 20° or less (e.g., 15° or less, 10° or less, 5° or less) receive enhanced emission. Modes having a propagation angle of 25° or more (e.g., 30° or more, in a range 40-50°, 50-60°, or 40-60°) receive inhibited emission. FIG. 7B illustrates various angular ranges. In some embodiments, emission into guided modes within the top light cone is preferred, and emission into guided modes beyond this cone and into the continuum of the sidewall light cone is not preferred.

In some embodiments, the top surface of the NW has a non-planar shape which modifies the emission direction of one or several modes. The top surface may be concave, convex, or textured.

Besides interference effects, the shape of the NW itself can be an important parameter for optical design. The radius/lateral dimension of the NW may be selected to carry a desired number of guided modes (e.g., 1, 2, 3, 4, 5, less than 10) with desired symmetries, at the peak emission wavelength of the active region. Some mode symmetries have preferred optical coupling to some electrical dipole orientations. In the case of c-plane III-nitride emitters (and some other semiconductors), for example, the emitting dipoles are in-plane. Such dipoles can couple preferentially to modes with HE and TE symmetry (as compared to modes with TM symmetry). The NW radius may therefore be selected to yield a mode of desired symmetry with a desired angle of propagation, or a desired far-field radiation pattern.

The interference effect is then configured to preferentially emit into this mode, and to suppress emission into modes propagating at other angles.

Figure 8:
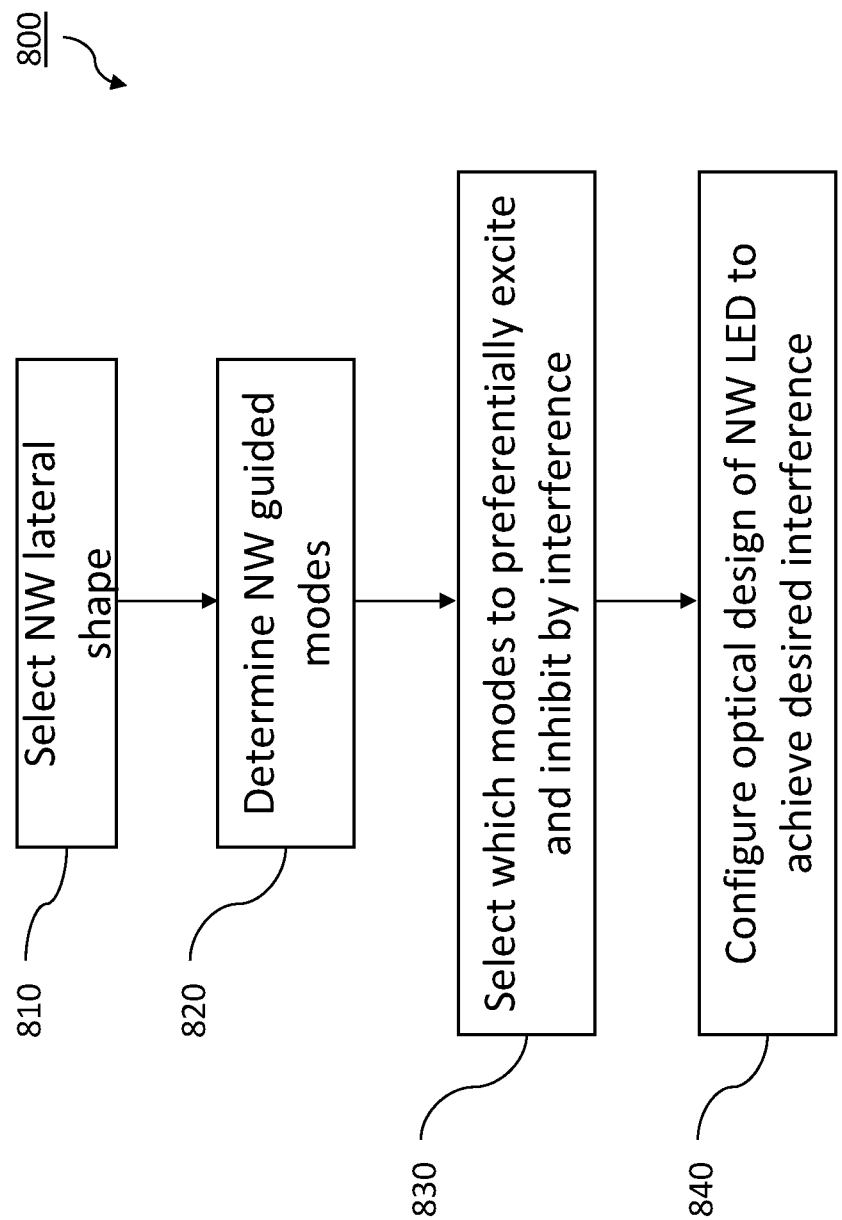
FIG. 8 is a flowchart showing an example method for designing a NW LED.

FIG. 8 shows an example of a method 800 to achieve this. In an initial step 810, the NW radius/lateral shape is selected, and the NWs supported modes are determined in step 820 (e.g., by modeling, which may assume a NW of infinite length). Some modes are selected as being desirable or undesirable, in step 830; this selection may be achieved by defining a figure of merit for the FFP (e.g., directional emission in 30° cone) and determine which modes contribute to this figure of merit (e.g. by computing their far-field pattern). Based on this, the rest of the optical design of the NW is configured (thickness of layers, mirror material and position) in step 840 to yield an interference to selectively excite the modes as prescribed.

In some embodiments, the lateral dimensions are selected such that the NW carries three modes. The first mode (e.g., the HE mode) has a low propagation angle and receives a substantial light emission; this mode has a directional FFP. The second mode (e.g., the TE mode) has a larger propagation angle; emission into this mode is inhibited by interference effects. The third mode has a symmetry (e.g., TM mode) which causes low light emission into this modes, as it does not couple well to light emission from the active region. A sufficient fraction of the total emission is directed in the first mode, resulting in a directional FFP.

In some embodiments, a NW has an active region with only one (or two, three) emitting QW. In some embodiments, substantially all the light is emitted from a region whose thickness is 20 nm or less (e.g., 15 nm or less, 10 nm or less, 5 nm or less). Such thin active regions may facilitate interference effects. It should be understood that other layers (e.g., "dummy" InGaN quantum well layers which do not substantially emit light) may be present, for instance to improve the material quality.

Some embodiments include devices that feature NWs emitting at different wavelengths and the NW optical design is different for each emission wavelength so that interference occurs at or near the same direction regardless of the emission wavelength. For example, a display can include three groups of NWs respectively emitting red, blue and green radiation. Constructive interference at normal incidence is sought. Each set of NWs include an active region, p-GaN and an Ag-based mirror (for which φ=−π/2). The thickness t of the p-GaN is selected for each emission wavelength to ensure that the interference condition is met: φ+2 n k t=2*π. This results in normal-incidence constructive interference for all NWs. The table below shows an example of how this can be achieved:

| | p-GaN index | p-GaN thickness (nm) | d1 (nm) | Emission wavelength λ (nm) | d1/λ |
|---|---|---|---|---|---|
| Blue NW | 2.5 | 112 | 281 | 450 | 0.62 |
| Green NW | 2.4 | 135 | 325 | 520 | 0.62 |
| Red NW | 2.3 | 168 | 386 | 620 | 0.62 |

In some embodiments, it may not be possible to independently control the thickness of the p-GaN layer for each group of NW. In such cases, the same effect can be achieved by forming a transparent conductive layer between the p-GaN and the p-metal, whose thickness is selected for each NW group to achieve the desired interference. The table below shows an example of how this can be achieved, in a case where the p-GaN thickness is the same for all NW groups:

|  | p-GaN index | p-GaN thickness | ITO index | ITO thickness (nm) | d1 (nm) | Emission wavelength λ (nm) | d1/λ |
|---|---|---|---|---|---|---|---|
| Blue NW | 2.5 | 112 | 1.8 | 0 | 281 | 450 | 0.62 |
| Green NW | 2.4 | 112 | 1.75 | 32 | 325 | 520 | 0.62 |
| Red NW | 2.3 | 112 | 1.7 | 75 | 386 | 620 | 0.62 |

While the indices, thicknesses and wavelengths given here are merely examples, one skilled in the art will understand more generally how to configure the optical design of NWs of different wavelengths to achieve simultaneous interference in or near the same direction.

Although the discussion above has focused on half-cavity effects on the p-side of the LED, other cavity effects can be harnessed to manipulate extraction and affect the FFP. For instance, in a device where light is emitted from the p-side (e.g., if the p-side contact is transparent or semi-transparent), a half-cavity effect may be used on the n-side of the device. This may be achieved by having a metal-based mirror n-contact, as already discussed above in the case of p-contacts. Alternatively, an epitaxial reflector (also known as Distributed Bragg Reflector (DBR)) may be integrated in the epitaxial stack. This DBR can be placed at an appropriate distance from the light emitting region to cause interference. More generally, one or several reflectors (including metal mirrors, DBRs, metal/DBR hybrids) can be placed on one or both sides of the active region to cause interference and affect the FFP. For III-nitride LEDs, DBRs may be made of layers of GaN, AlGaN, AlInGaN, AlInN.

In some embodiments, the lateral region surrounding the light-emitting region has a relatively low index. This reduces sidewall light emission. For instance, the lateral region between NWs includes air or a transparent material with a low index (e.g., 1.4 or less, 1.3 or less, 1.2 or less). Low-index materials can be obtained by various approaches, including use of a porous medium (e.g., nanoporous dielectric including an oxide or nitride dielectric); or use of a material wherein nanoscopic low-index inclusions have been dispersed (e.g., hollow dielectric spheres with an air core, dispersed in a dielectric or sol-gel or other transparent medium).

In some embodiments, metal overlaps with the NW sidewalls—for instance because a metal (n-contact or p-contact) is deposited on a sample having NWs and a filler/planarizer material which is slightly over-etched (leaving the NWs' top surface protruding slightly from the planarizer). This may cause optical loss if the emitted light is coupled to absorbing plasmons. Accordingly, in embodiments, the LED is configured to minimize absorption, including absorption due to plasmon coupling. For instance, the metal and geometry can be selected to reduce surface plasmon coupling. This may be achieved with a metal having suitable refractive index. Depending on the emission wavelength, a given metal (e.g., Ag, Al, Ti, Ni, Au, other metals) may have lower plasmon absorption because the plasmon frequency is far from the emission frequency. This may further be achieved by replacing sharp corners (e.g., at the top of a NW) with angled or curved or rounded surfaces (including semipolar planes). In some embodiments, the metal overlaps with the NW sidewalls and is configured to cause extraction of surface plasmons.

In some embodiments, metal overlap with the NW sidewalls is avoided. This can be achieved, for example, by having a planarizer layer which is exactly or substantially flush with the NW top surface (e.g., within +/−1 nm or 3 nm or 5 nm or 10 nm or 20 nm). This may be achieved by inserting a TCO layer between the NW top surface and the metal. The TCO's surface (in contact with the metal) may be smoother than the NW top surface, reducing or removing surface topology which leads to metal absorption. In some embodiments a planarizer is formed around NWs and the planarizer is slightly over-etched, leading to a surface with protruding NWs characterized by a height. A TCO is formed to make contact with the NWs, the TCO having a top surface characterized by a second height 80% or smaller (e,g, 50% or smaller, 20% or smaller, 10% or smaller, 5% or smaller, 1% or smaller) of the first height. A metal portion is formed over the TCO.

Collective Effects on Directionality

In some embodiments, multiple NWs are configured in a predetermined spatial configuration, such as a two-dimensional array of NWs. The array may be periodic with square, rectangular or a triangular lattice. In some embodiments, the array can be quasi-periodic. For example, it may have a short-scale periodicity with longer-scale variation (e.g., it may form a metasurface where the array pitch varies spatially).

Collective optical effects in such NW arrays are known in the art. For example, the array may act as a diffraction grating (or photonic crystal) to diffract in-plane-propagating light to an out-of-plane direction. Embodiments can combine such collective effects with individual effects, to achieve improved directionality. Accordingly, the techniques disclosed above are used to configure the optical design of individual NWs to preferentially emit light in some directions. The optical design of the array can be further configured to diffract lateral light out-of-plane. Embodiments therefore include methods of configuring the both design of individual NWs, and the design of a NW array, to achieve a desired FFP.

Figure 9:
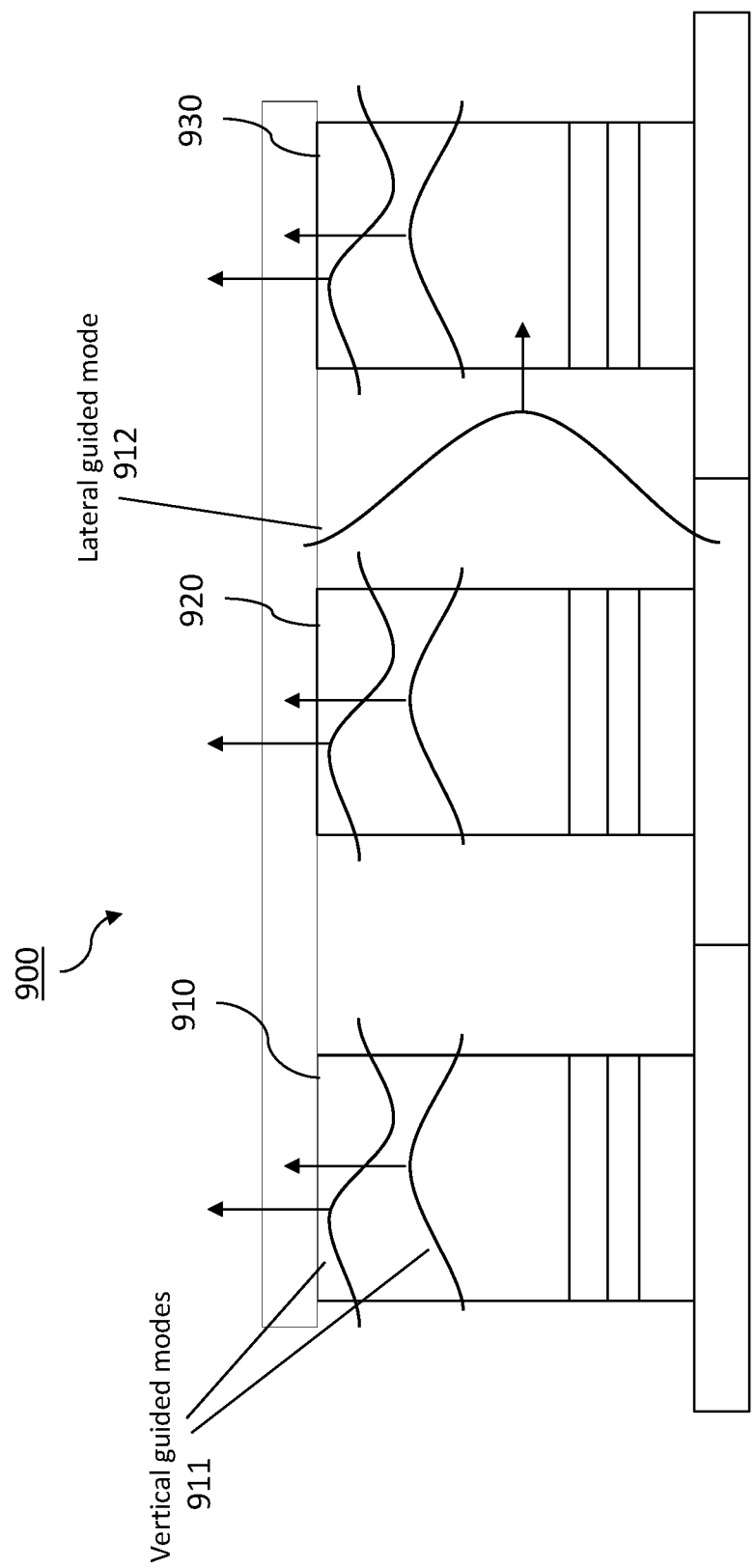
FIG. 9 is a schematic cross-sectional view of NWs in an example array of NW LEDs.

Referring to FIG. 9, an extended array 900 of NWs 910, 920, and 930 support a variety of optical modes. Each NW 910, 920, 930 supports guided modes 911 in the vertical direction (i.e., along the axis of the NWs). Further, sidewall light emitted by each NW may be guided in-plane (because the array of NWs forms an effective waveguide in the lateral direction), resulting in the formation of lateral guided modes 912. These guided modes can reduce the overall light extraction efficiency, and should be extracted.

Embodiments can harness interference effects to selectively excite some vertical modes, as taught herein. Further, the optical design of the NW array 900 can be configured to diffract the lateral guided modes in a desired direction. For instance, the pitch of the NW can be selected to meet the Bragg condition for diffraction at an angle where emission is desired.

Color/Chromaticity Effects

Some embodiments feature NWs that are emitters for a display. The display includes multiple pixels, each pixel having at least three subpixels which respectively emit substantially blue, green and red radiation. In such embodiments, it may be desirable to avoid substantial differences in FFP between the sub-patterns, as these can cause a variation in color-over-angle (COA). For instance, if the display emitter can be set to emit white light (e.g., at the D65 color point), its perceived color may vary depending on the angle of light emission, because different subpixels have different FFPs.

Accordingly, in some embodiments, each subpixel is configured to provide a desired FFP, and the three subpixels are configured so that their FFP are similar. This can be useful to reduce variations in COA. Variations in COA can be quantified by variations in chromaticity in a color space, such as the (xy) or (uv) or (u'v') color diagram. In particular, the (u'v') color diagram may be considered because of its improved color uniformity, and the corresponding chromaticity difference Du'v' may be used to quantify color differences. Given a desired white chromaticity for the display (such as D65), various directions of emission all have a chromaticity difference to D65 which is 5E−3 or less (e.g., 3E−3 or less, 1E−3 or less).

FIGS. 10A-10E are a series of plots illustrating COA effects. FIG. 10A is a plot showing intensity as a function of wavelength for a set of RGB LEDs configured to emit white light with D65chromaticity when mixed appropriately. The peak wavelength/FWHM (in nm) of the LEDs are respectively 460/25, 530/30, and 650/45. This choice of primaries enables coverage of the DCI-P3 color gamut. FIG. 10B shows a plot showing FFPs as a function of angle for a first directional system where the B, G, and R primaries have rather different FFPs. FIG. 10C is a plot showing FFPs as a function of angle for a second directional system where the B, G, and R primaries have rather similar FFPs. FIG. 10D is a plot showing the variation in chromaticity with angle in the (u'v') diagram, for the example system of FIG. 10B. Here each dot corresponds to a 5° step in θ. At normal incidence, the system emits at D65(marked by the circle symbol), as designed. However, with increasing angle, the chromaticity shifts significantly from D65. FIG. 10E is a plot showing the chromatic distance Du'v' from D65 as a function of emission angle. For the first system, Du'v' acquires large values: at θ=30°, Du'v'=5e−3. In contrast, for the second system (FIG. 10C), Du'v' values remain lower: at θ=30°, Du'v'=1.5e−3.

In some embodiments, the optical design of each subpixel is configured to obtain a near-constant COA. For instance, the number of guided modes in blue, green, and red subpixels are substantially equal. The interference effect caused by mirrors in each subpixel causes enhancement or inhibition at the same angle. In some embodiments, one or several dimensions of the subpixels are proportional to their emission wavelengths (i.e. a thickness or distance divided by the wavelength is equal for each subpixel). For instance, the radius divided by the emission wavelength is substantially equal for each NW type. One example is as follows (radius/emission wavelength): 225/450 nm, 260/520 nm, 310/620 nm. Because Maxwell's equations scale with wavelength, such scaling enables a similar optical behavior from the subpixels and facilitates the same FFP. In some embodiments, the scaling takes into account dispersion of the refractive index, so that an optical path is equal in the subpixels. The optical path may be associated with the NW radius, or to the interference of emitted light by a mirror.

In some embodiments, the COA variation is small in a first angular range but is larger in a second angular range. This may be acceptable if the display system mostly relies on emission in the first angular range. For instance, an optical system collects light emitted between 0° (normal incidence) and a cutoff angle, and does not substantially collect light emitted between the cutoff angle and 90° (horizontal incidence). In such embodiments, the COA may be below a desired value in the first angular range. For instance, within an emission cone of +/−20° (or +/−10°, +/−30°, +/−45°, +/−90°) from normal incidence, the chromaticity of the emission is less than Du'v' of 5E−3 (e.g., 3E−3 or less, 1E−3 or less).

Accordingly, in some embodiments, a display is configured to emit a white chromaticity. The display has an emission within an angular range, whose angle-averaged chromaticity is substantially the white chromaticity. Each direction within the angular range has a local emission having a local chromaticity, and the absolute Du'v' difference between each local chromaticity and the average chromaticity is less than 1E−3.

In some embodiments, instead of a simple chromaticity diagram, a more complex color space (such as CIELAB or CIECAM or CAM02-UCS) may be employed. In such cases, a color difference metric is selected and a criterion for the COA is selected. For instance, the color space may be CIELAB and the color difference may be the Euclidean distance in this space. The white point is the target color of the display (e.g., D65).

Some embodiments combine substantial directionality with small COA variations.

Miscellaneous

Although various embodiments make reference to GaN-based LEDs, the teachings apply to other materials. The NW LEDs may comprise materials made other III-nitride compounds (including AlGaN, InGaN, AlInGaN) or other semiconductors (including AlGaAs, AlInGaP, AlInGaAsP, ZnO).

The thickness values disclosed herein may accept some tolerance. For instance, the values may be understood with a tolerance of +/−5 nm (e.g., +/−10 nm, +/−15 nm, +/−20 nm).

Although the discussion of this disclosure focuses on NW LEDs, the teachings may further be applied to other types of LEDs. For instance, a micro-LED may have a well-defined mode structure despite not having a NW shape. As taught herein, the optical design of the LED may be configured to cause optical interference with a reflective mirror to cause selective excitation (enhanced or suppressed) of some optical modes. In addition, a set of RGB micro-LEDs may display preferential directionality despite not having a NW geometry. As taught herein, the optical design of the LEDs of various colors may be configured so that the FFP of each color is substantially similar, thus avoiding COA effects.

As an example, the LEDs may have a planar geometry—for instance, they may be micro-LEDs with lateral dimensions in a range 1-20 μm and vertical dimensions in a range 1-10μm. In a specific example, the LEDs are parallelepipeds with dimensions of about 4×4×1 μm. In such LEDs, the lateral dimensions may be large enough that there are many modes excited by the light-emitting medium regardless of the LED's wavelength, so that scaling the lateral dimensions of the R/G/B LEDs to their wavelengths may be superfluous. Regardless, the teachings disclosed above may be applied to ensure that the R/G/B LEDs have a similar FFP to reduce COA artifacts. For instance, the LEDs may still benefit from interference effects between a light-emitting layer and a mirror; in this case, scaling the optical thickness between the light-emitting layer and the mirror (d1) may produce a similar COA for each color. Namely, the ratio of the optical thickness by the wavelength may be substantially equal for the R/G/B LEDs.

Figures 11A, 11B, 11C:
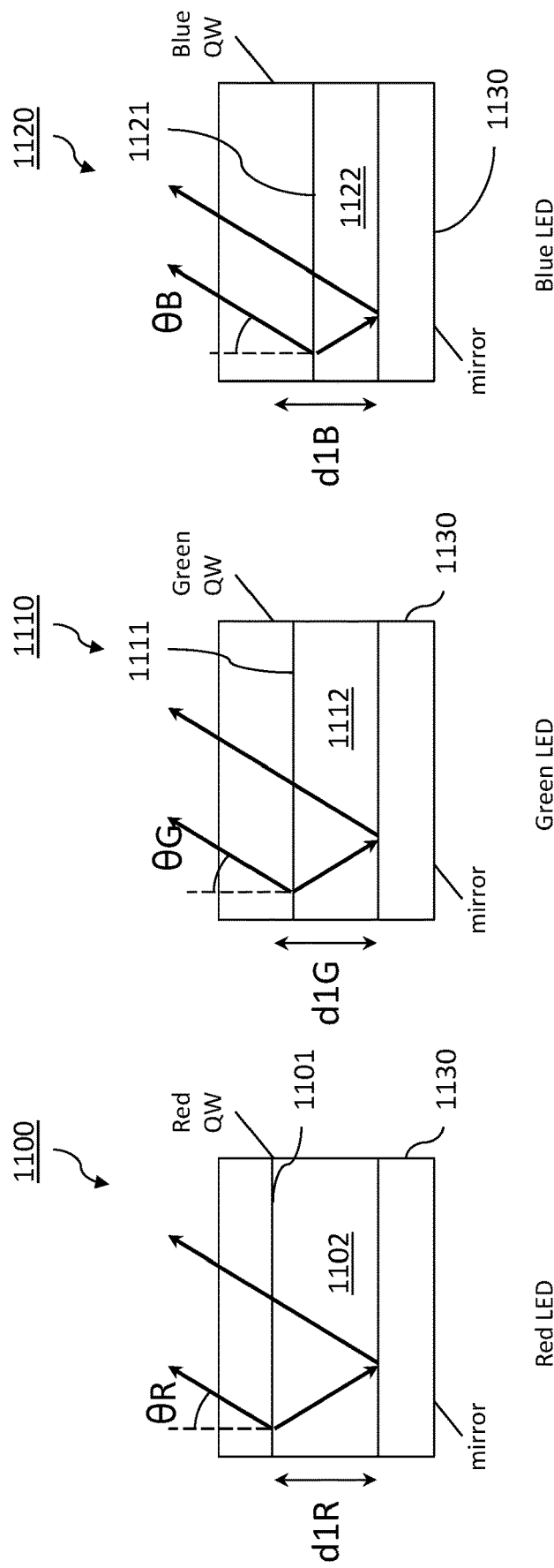
FIG. 11A is a schematic cross-sectional view of an example red LED.
FIG. 11B is a schematic cross-sectional view of an example green LED.
FIG. 11C is a schematic cross-sectional view of an example blue LED.

FIGS. 11A-11C illustrates such an embodiment. FIGS. 11A-11C show red, green and blue LEDs (1100, 1110, and 1120), respectively, each having a planar shape. LEDs 1100, 1110, and 1120 each have a mirror 1130 (e.g., a p-mirror). LED 1100 has an emission layer 1101 (e.g., a red QW layer) separated from mirror 1130 by a semiconductor layer 1102. LED 1110 has an emission layer 1111 (e.g., a green QW layer) separated from mirror 1130 by a semiconductor layer 1112. LED 1120 has an emission layer 1121 (e.g., a blue QW layer) separated from mirror 1130 by a semiconductor layer 1122. The respective optical thicknesses d1R, d1G and d1B between the emitters and the mirror (i.e., the optical thicknesses of layers 1102, 1112, and 1122, respectively) are configured to be substantially proportional to the respective emission wavelengths $\lambda R$, $\lambda G$, $\lambda B$, such that each LED has a similar FFP. For instance, each FFP has an angle of preferential emission $\theta R$, $\theta G$, $\theta B$ (with the FFP having a peak at the corresponding angle) and the angles are substantially equal. In some embodiments these angles are equal within +/−5° (or +/−1°, +/−3°, +/−7°, +/−10°).

FIGS. 12A-12D further illustrate this approach, by modeling the FFP and chromaticity of planar LEDs having a half-cavity effects. The LEDs have respective emission wavelengths of 450 nm, 520 nm, 620 nm. They include a quantum well at a distance t from a silver mirror, placed in a GaN medium (n=2.5) and emitting into air. In a simple case, all three LEDs share the same value t=115 nm (this value is optimized for extraction for the blue LED). This results in the FFPs shown in the plot of FIG. 12A: the green and red LEDs have suppressed emission at large angles, because they are detuned (the value of t is too low for extraction at these longer wavelengths). In contrast, certain embodiments correct for this by having near-constant values of t/lambda. Exactly-constant values would be achieved by t_b=115 nm, t_g=133 nm, t_r=158 nm. Instead we take t_b=110 nm, t_g=133 nm, t_r=163 nm—i.e., the blue and red LEDs are detuned from the target value by −5 nm and +5 nm respectively, to illustrate that small deviations from nominal values are acceptable. The resulting FFPs are shown in the plot in FIG. 12B. The difference between the three FFPs is much less pronounced than in FIG. 12A.

Next, the LEDs are tuned to emit a D65 chromaticity at normal incidence, and the resulting COA metric Du'v' is shown in the plot of FIG. 12C. For the system of FIG. 12A, the COA is substantial, whereas for the embodiment of FIG. 12B, it is significantly reduced. FIG. 12D shows a zoomed version of FIG. 12C. FIG. 12D shows that the embodiment maintains Du'v' below 3E−3 in a 30 deg cone, and below 6E−3 in a 45 deg cone. This illustrates how proper scaling of the LEDs' dimensions can enable a low COA. In this example, the dispersion of the refractive index with wavelength was ignored, but it could of course be accounted for (rather than having the physical distance t scale with the wavelength, one would have the optical distance d1 scale with the wavelength).

Figure 13:
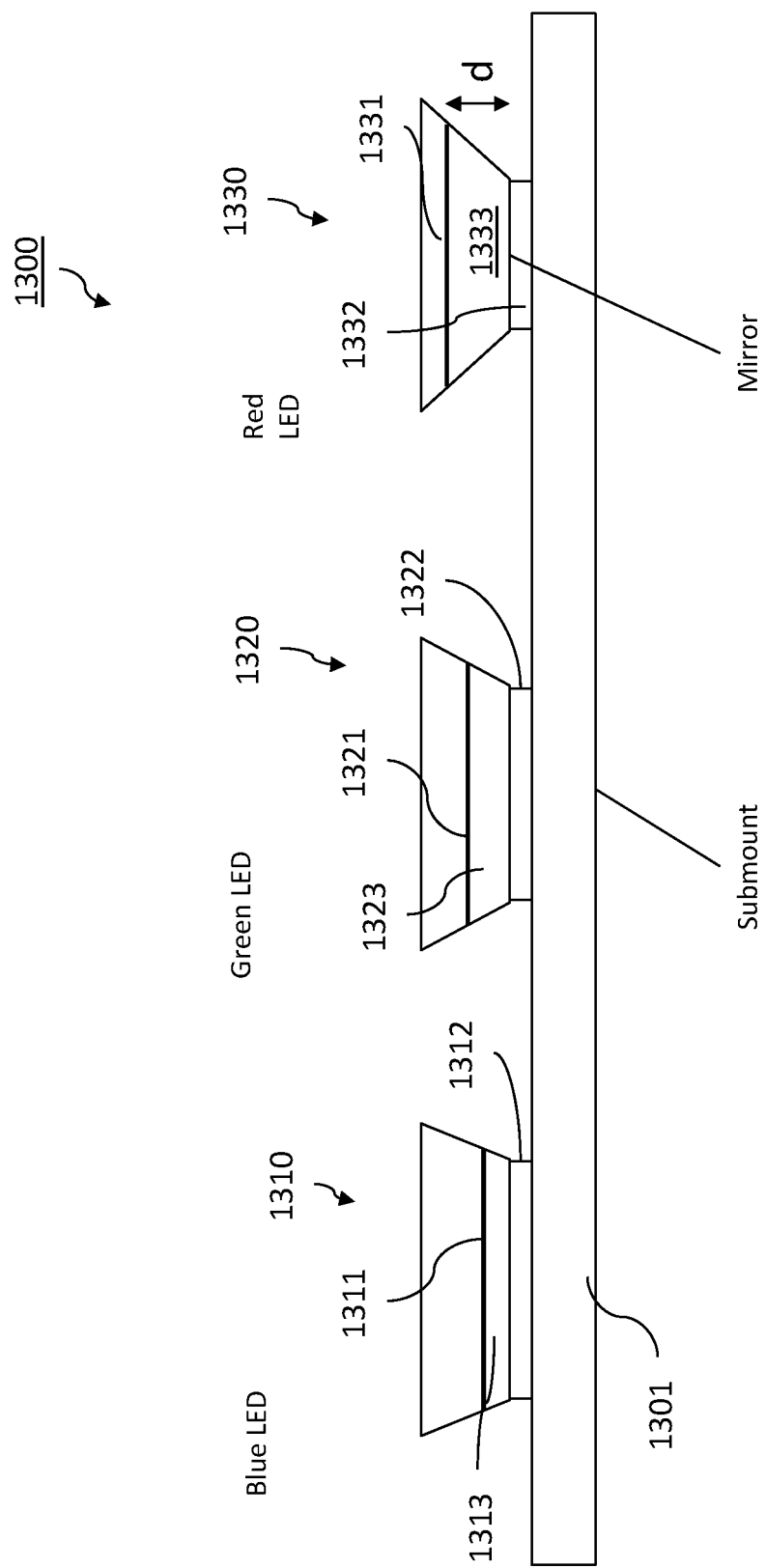
FIG. 13 is a schematic cross-sectional view of an example device that includes three different LEDs.

The teachings may be generalized to other geometrical properties of the LEDs. For instance, in some embodiments, the LEDs can have slanted or non-vertical sidewalls and the slopes/shapes/angles of the sidewalls are configured such that the FFP is substantially equal for the R/G/B LEDs. FIG. 13 illustrates an array 1300 having R/G/B LEDs with non-vertical sidewalls. Specifically, a blue LED 1310, a green LED 1320, and a red LED 1330 are all supported by a common submount 1301. Each LED includes a mirror (mirrors 1312, 1322, and 1332) and a light emission region (regions 1311, 1321, and 1331, respectively). The mirrors and active regions are separated by a corresponding semiconductor stack (stacks 1313, 1323, and 1333, respectively). The value of d1 (the optical thickness of stacks 1313, 1323, and 1333) and the geometry of the LEDs are configured to ensure a similar FFP between the LEDs to reduce COA. For instance, the value of d1 may first be selected according to a resonance condition for each wavelength, and the rest of the geometry (such as sidewall angles, LED height, surface state of various surfaces) may further be configured to make the FFPs substantially similar. In some embodiments, some surfaces are roughened. For instance, the top surface of the LEDs is roughened (e.g by a chemical or photo-chemical or photo-electro-chemical or dry etch). Such roughness may interact with cavity effects to provide high extraction together with a more diffuse FFP which is less prone to COA artifacts.

Optical thicknesses, which are products of physical thicknesses and refractive indices, are expressed in units of length. Embodiments can include an LED having a light-emitting region and a reflective region (e.g., a mirror). For the reflective region to cause interference in the emitted light with only a few lobes, the optical distance should be small enough. For instance, it should be 20× or less (e.g., 10× or less, 5× or less, 3× or less, 2× or less) the wavelength of light. Alternatively, for visible wavelengths, it can be 10 µm or less (e.g., 5 µm or less, 2 µm or less, 0.5 µm or less).

For definiteness in the case of LEDs with a relatively thick active region, unless otherwise defined, the optical distance is measured from the physical center of the active region. In cases where the actual center of emission is known (i.e., if it is known that the emission comes from the p-side of the active region), one of skill in the art will know to use this value instead of the physical center of the active region.

The teachings apply to various micro-LEDs. Micro-LEDs may be distinguished from conventional LEDs by their dimensions (typically, lateral dimensions of 50 µm or less). In some embodiments, a micro-LEDs chip has a characteristic lateral dimension of 50 µm or less (e.g., 25 µm or less, 20 µm or less, 15 µm or less, 10 µm or less, 7 µm or less, 5 µm or less, 3 µm or less).

Further, a micro-LED chip may be distinguished from a conventional LED chip by its light-emitting properties, including the ratio of light emitted from top versus side facets. In some embodiments, the LED has a top facet which is substantially planar and parallel to the plane of the light emitting region, and sidewall facets which intersect the top surface (these may be planar or curved, vertical or slanted). All facets may be between a semiconductor (including a III-V semiconductor, a III-nitride compound, an AlInGaAsP compound) and an outside medium (including air, or a transparent medium such as silicone or epoxy or an encapsulant). Some micro-LEDs are characterized by having a relatively large ratio of light emission from the sidewall facets to the total light emitted (the ratio, for clarity, can be defined as (light emitted from sidewalls)/(light emitted from sidewalls+top)). This ratio may be 20% or more (e.g., 30% or more, 40% or more, 50% or more, e.g., 55%). This contrasts with thin-film conventional LEDs, where the ratio may be less than 10% (and sometimes less than 5%). This also contrasts with other large-size LEDs, for instance those where the sapphire substrate is retained, because in these conventional LEDs light is emitted from the substrate rather than the semiconductor sidewall itself. In some embodiments, the growth substrate of the LED is removed.

More broadly, some embodiments are characterized by having a combination of small lateral dimensions and by having at least four facets, each of the facets emitting at least 5% (or 10%) of the total emitted light. These can be termed multi-facet microLEDs, and generalize microLEDs with sidewall emission. These LEDs can also be characterized by their physical dimensions, since the surface area of a facet is often roughly proportional to the light emission from the facet. In some embodiments, each of the facets has a surface area which is at least 5% (or 10%) of the total surface area of light emission. In some embodiments, the LED has a top facet and a plurality of sidewalls, and the cumulative surface area of the sidewalls is at least 20% (or 50%, 100%) of the surface area of the top facet.

In multi-facet microLEDs, light emitted from each facet has a facet FFP. The facet FFPs combine to form an overall FFP for the micro-LED. This is illustrated in FIG. 14A, which shows an LED 1400 having slanted sidewalls. The FFP from a top facet 1410 and a slanted sidewall 1420 are shown. In embodiments, the facet FFPs are jointly configured to obtain a desired FFP.

In some embodiments, the LED has a light-emitting region and a reflective region separated by an optical thickness, and the ratio of the optical thickness by the emission wavelength is selected to promote emission in a given direction (i.e., at a selected angle in the FFP). The FFP from each facet may cooperate to jointly produce directional emission. For instance, a first facet has a first preferential angle of emission and a second facet has a second preferential angle of emission, and the angles are substantially equal (e.g., within less than +/−20 deg, less than +/−10 deg, less than +/−5 deg). This can be achieved by a combination of configuring the optical thickness (such that cavity effects yield angular peaks inside the LED) and configuring the geometry of the sidewalls.

An example is illustrated in FIG. 14B, which shows a multi-faceted LED 1450. The optical distance is configured to produce preferential emission in first and second inner directions inside the LED chip, as taught herein. The geometry of the facets (here, the inclination angle of the slanted sidewall) are configured such that light propagating at the first and second inner directions is emitted outside the LED at first and second outer directions by two facets, the outer directions being substantially similar.

In some embodiments, one or several facets (including top facet, sidewalls) are not optically smooth, but instead are textured or roughened. The RMS roughness may be 100 nm or more (e.g., 500 nm or more, 1 µm or more).

These teachings may further be applied to multiple LEDs (e.g., emitting at different wavelengths, such as R/G/B LEDs) which are configured to have substantially similar FFPs or a same direction of preferential emission.

Figure 15:
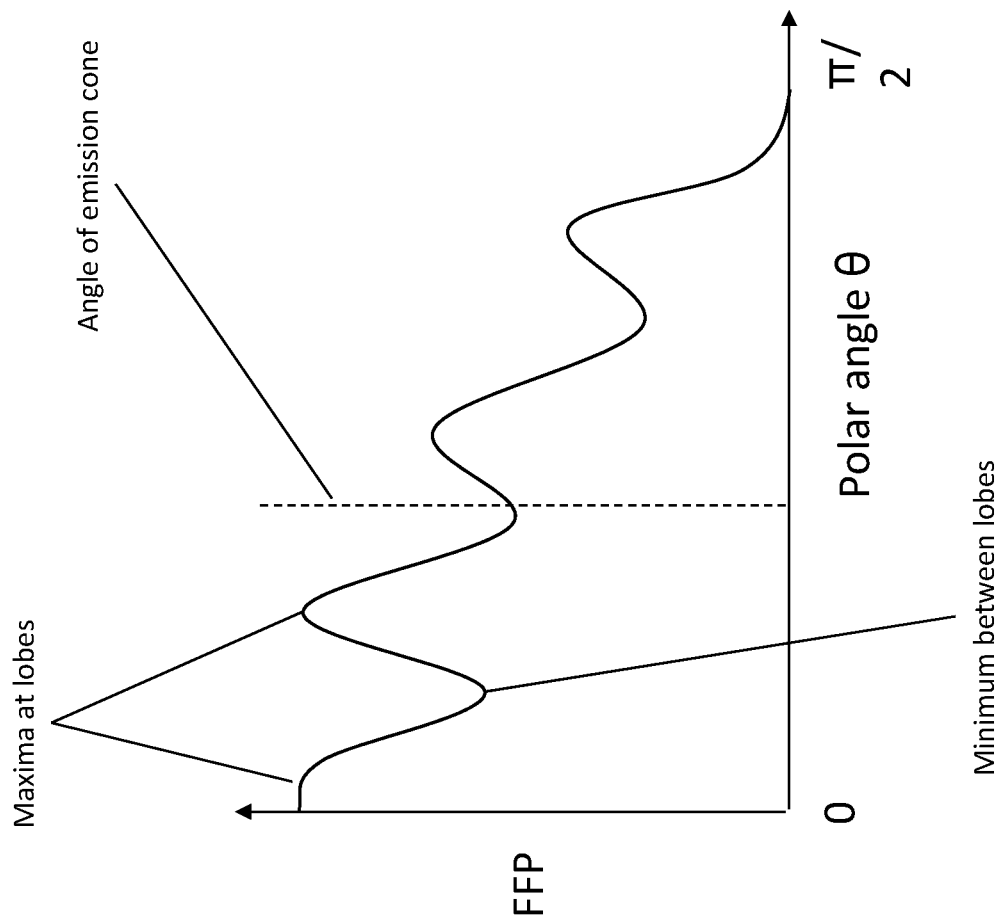
FIG. 15 is a plot showing FFP as a function of polar angle illustrating the contrast definition between two lobes within an angular emission cone of an example LED.

In some embodiments the FFP is characterized by having several angular lobes (e.g., several local maxima at different angles of emission). There may be at least 2 lobes (e.g., 3 or more lobes, 5 or more lobes). The contrast of the FFP lobes, defined as the ratio of the maximum intensity at the lobes divided by the minimum intensity between two lobes, may be 1.1 or more (e.g., 1.2 or more, 1.5 or more, 2 or more, 5 or more). Such high contrasts characterize LEDs having preferential directions of emission. For simplicity, the FFP may be averaged over azimuthal angle before the contrast is calculated. The contrast may be calculated within a desired angular cone of emission. FIG. 15 illustrates the contrast definition between two lobes within an angular emission cone.

Figure 16:
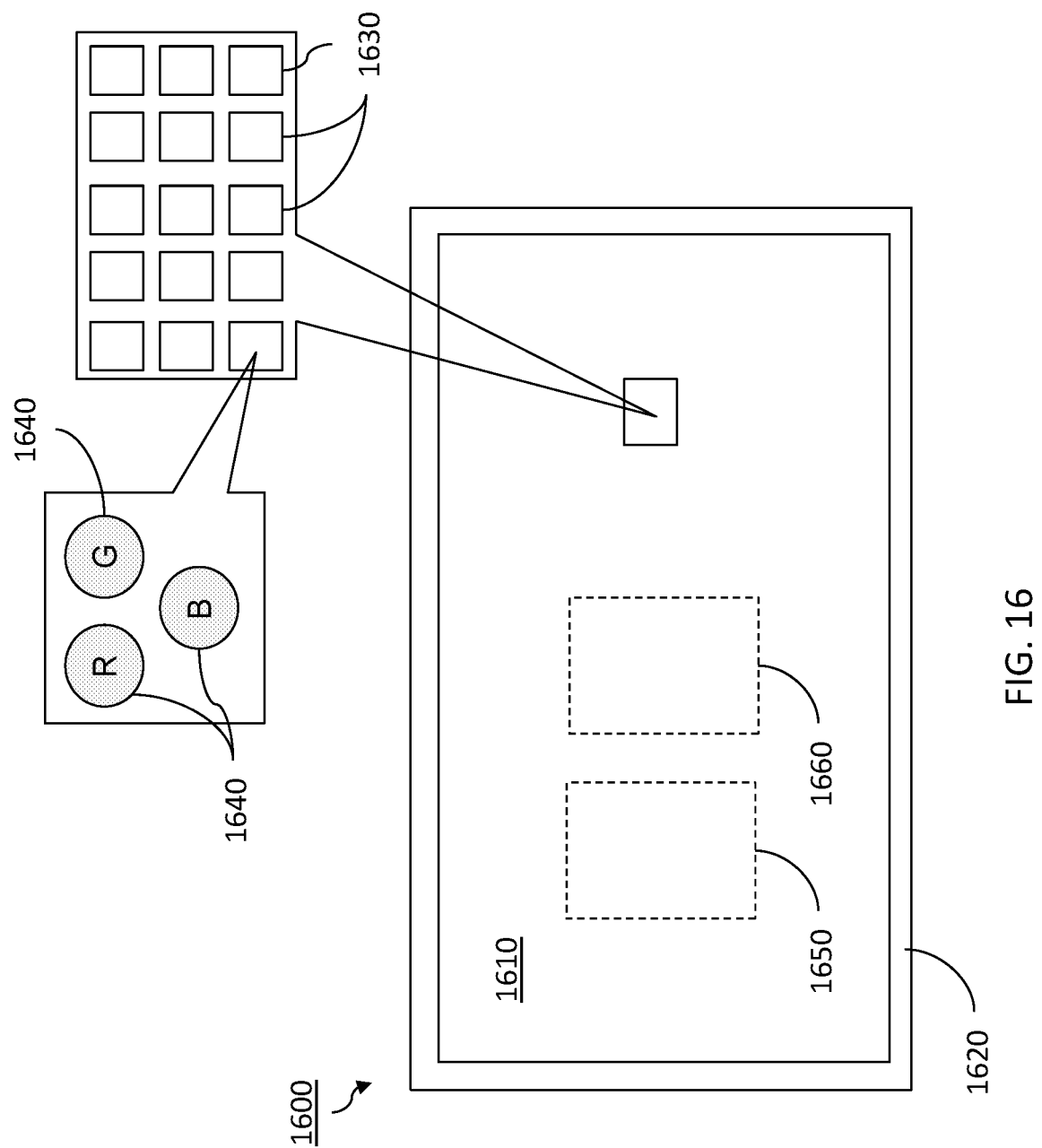
FIG. 16 is a schematic diagram of a display composed of LEDs.

As noted previously, the disclosed LEDs, including NW LEDs and micro-LEDs, can be incorporated into a display to provide beneficial COA properties. Referring to FIG. 16, an example display 1600 includes an active area 1610 surrounded by a bezel 1620. The active area is composed of an array of pixels 1630, each composed of three sub-pixels (e.g., R, G, B sub-pixels) 1640. Each sub-pixel 1640 is composed of one or more LEDs (e.g., multiple NW LEDs) each designed to emit light at the same wavelength. Display 1600 also includes an electronic controller 1650 and a power source 1660, which are configured to supply drive signals to the pixels. The size and resolution of display 1600 can vary as desired. Smaller displays, such as those for wearable devices (e.g., smart watches), mid-size displays (e.g., for smartphones), and larger displays (e.g., desktop monitors, TVs).

Embodiments can further include a method of configuring a display that includes:

selecting an emission cone characterized by a direction and a half-angle, the display's emission properties pertaining to the emission cone selecting a display white point having a white chromaticity, and a chromaticity tolerance (e.g., 1E−3)

configuring R/G/B LEDs having non-Lambertian emission patterns FFPr, FFPg, FFPb, such that when the display emits the white point, all directions within the emission cones have a chromaticity whose Du'v' distance to the white chromaticity is below the chromaticity tolerance.

Embodiments further include devices obtained by this method. Herein, a non-Lambertian FFP is one which deviates significantly (e.g., by at least 10%) from a Lambertian FFP in a direction within the emission cone.

Embodiments can include methods of operating LEDs as taught herein, and display systems (including AR and VR displays) including LEDs as taught herein.

Embodiments may include violet LEDs, blue LEDs, green LEDs, yellow LEDs, red LEDs. For definiteness, the corresponding ranges for peak wavelengths are: 400-430 nm, 430-480 nm, 500-550 nm, 550-600 nm, 600-680 nm.

In addition to effects on directionality, embodiments may be configured to achieve a desirable value of the Purcell factor FP (which characterizes the relative variation in the spontaneous emission rate caused by the photonic environment, compared to emission in an infinite homogeneous semiconductor). The value of FP can be controlled by the value of d1 and cavity interference effects, as is known in the art. In some embodiments, FP is 0.8 or more (e.g., 0.9 or more, 1 or more, 1.1 or more, such as 1.2).

Other embodiments are in the claims.

What is claimed is:

1. A full color display comprising a plurality of pixels, the display having a white point, a direction of emission and a solid angle of emission around the direction of emission characterized by a half-cone angle $\theta$, each pixel comprising:
 a red sub-pixel comprising a red LED having a first geometry configured to emit red light into a range of emission angles, such that a fraction of power of the red sub-pixel emitted within the solid angle of emission is at least $1.2*(1-\cos(\theta)^2)$;
 a green sub-pixel comprising a green LED having a second geometry configured to emit green light into a range of emission angles, such that a fraction of power of the green sub-pixel emitted within the solid angle of emission is at least $1.2*(1-\cos(\theta)^2)$; and a blue sub-pixel comprising a blue LED configured to emit blue light into a range of emission angles, such that a fraction of power of the blue sub-pixel emitted within the solid angle of emission is at least $1.2*(1-\cos(\theta)^2)$;

wherein the red LED, the green LED, and the blue LED are configured such that, in any direction within the solid angle of emission, white light emitted by the display has a chromaticity difference Du'v' from the white point of the display which is less than 0.01.

2. The display of claim 1, wherein each of the blue LED, the green LED, and the red LED respectively comprise a light emitting region and a reflective region located an optical distance less than 1 μm from an active region, such that optical interference within each LED causes light to be emitted in a preferential direction in a far field, wherein the respective optical distances between the light emitting region and the reflection region of the red LED, the green LED and the blue LED are configured such that the respective preferential directions of emitted light from the red LED, the green LED, and the blue LED are within +/−10° of each other.

3. The display of claim 2, wherein the respective preferential directions of emitted light from the red LED, the green LED, and the blue LED are within +/−5° of each other.

4. The display of claim 2, wherein the respective preferential directions of emitted light from the red LED, the green LED, and the blue LED are within +/−3° of each other.

5. The display of claim 1, wherein:
the blue LED comprises a blue light-emitting region emitting light at a blue wavelength, and a blue reflective region separated from the blue light-emitting region by a first optical distance;
the green LED comprises a green light-emitting region emitting light at a green wavelength, and a green reflective region separated from the green light-emitting region by a second optical distance; and
the red LED comprises a red light-emitting region emitting light at a red wavelength, and a red reflective region separated from the red light-emitting region by a third optical distance,
wherein a ratio between the first optical distance and the blue wavelength, a ratio between the second optical distance and the green wavelength, and a ratio between the third optical distance and the red wavelength are all within 10% of each other.

6. The display of claim 1, where each LED has a characteristic lateral dimension of 50 μm or less.

7. The display of claim 6, where at least one of the red LED, the green LED, and the blue LED is a multi-facet LED which comprises a top facet and several sidewall facets, wherein during operation of the multi-facet LED, light is emitted from each facet, and a cumulative surface area of the sidewall facets is at least 20% of a surface area of the top facet.

8. The display of claim 7, wherein at least 20% of the light emitted by the multi-facet LED is emitted through the sidewall facets.

9. The display of claim 6, wherein light emitted from the top facet is preferentially emitted in at first angle with respect to the top facet, light emitted from one of the sidewall facets is preferentially emitted at a second angle with respect to the top facet, and the first and second angles are within +/−10° of each other.

10. The display of claim 1, wherein θ is in a range from 5° to 45°.

11. The display of claim 1, wherein the red LED, the green LED, and the blue LED are each characterized by respective shapes such that, in any direction within the solid angle of emission, white light emitted by the display has the chromaticity difference Du'v' from the white point of the display less than 0.01.

12. The display of claim 1, wherein the red LED, the green LED, and the blue LED are respectively characterized by a physical dimension and by an emission wavelength, and a ratio between the physical dimension and the emission wavelength for each LED are within +/−10% of each other.

13. The display of claim 12, wherein the ratio for each LED is approximately equal.

14. The display of claim 13, wherein the physical dimension is selected from the group consisting of: radius, height, characteristic vertical dimension, characteristic horizontal dimension, and optical distance between a light-emitting region and a reflector of the LED.

15. The display of claim 1, wherein the white point has a chromaticity which is substantially equal to D65.

16. The display of claim 1, wherein each LED comprises a metal-based mirror, and is configured substantially according to an equation $\varphi + 4\pi d \cos(\theta)/\lambda = m*2*\pi$, where $\varphi$ is a phase shift characterizing an interface between the metal-based mirror and an adjacent layer of the LED, d is an optical thickness between the interface and a light-emitting region of the LED, θ is an angle in a range from 0° to 30°, and m is an integer in a range from 1 to 3.

17. The display of claim 16, wherein the optical thickness between the interface and the light-emitting region, d, is within 10 nm of satisfying equality.

18. A full color display comprising a plurality of pixels, the display having a white point, a direction of emission and a solid angle of emission around the direction of emission characterized by a half-cone angle θ, each pixel comprising:
a red sub-pixel comprising a plurality of red nanowire light emitting diodes (NW LEDS) configured to emit red light into a range of emission angles, such that a fraction of power of the red sub-pixel emitted within the solid angle of emission is at least $1.2*(1-\cos(\theta)^2)$;
a green sub-pixel comprising a plurality of green NW LEDS configured to emit green light into a range of emission angles, such that a fraction of power of the green sub-pixel emitted within the solid angle of emission is at least $1.2*(1-\cos(\theta)^2)$; and
a blue sub-pixel comprising a plurality of blue NW LEDS configured to emit blue light into a range of emission angles, such that a fraction of power of the blue sub-pixel emitted within the solid angle of emission is at least $1.2*(1-\cos(\theta)^2)$,
wherein the NW LEDs are configured such that, in any direction within the solid angle of emission, white light emitted by the display has a chromaticity difference Du'v' from a white point of the display which is less than 0.01.

19. The display of claim 18, wherein θ is in a range from 5° to 45°.

20. The display of claim 18, wherein the red NW LEDs, the green NW LEDs, and the blue NW LEDs are each characterized by respective shapes such that, in any direction within the solid angle of emission, white light emitted by the display has the chromaticity difference Du'v' from the white point of the display less than 0.01.

* * * * *